(12) United States Patent
Shinozaki et al.

(10) Patent No.: US 7,656,733 B2
(45) Date of Patent: Feb. 2, 2010

(54) SEMICONDUCTOR MEMORY DEVICE

(75) Inventors: Masao Shinozaki, Tokyo (JP); Hajime Sato, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 114 days.

(21) Appl. No.: 12/059,220

(22) Filed: Mar. 31, 2008

(65) Prior Publication Data
US 2008/0266928 A1 Oct. 30, 2008

(30) Foreign Application Priority Data
Apr. 26, 2007 (JP) ............................. 2007-116379

(51) Int. Cl.
*G11C 7/02* (2006.01)
(52) U.S. Cl. ................ 365/210.1; 365/154; 365/230.03
(58) Field of Classification Search ................. 365/210, 365/154, 203, 230.03, 721
See application file for complete search history.

(56) References Cited

U.S. PATENT DOCUMENTS

2007/0280022 A1* 12/2007 Nguyen et al. .............. 365/210

2008/0112245 A1* 5/2008 Ostermayr et al. ....... 365/210.1

FOREIGN PATENT DOCUMENTS

JP 2006-004463 A 1/2006

* cited by examiner

*Primary Examiner*—Huan Hoang
(74) *Attorney, Agent, or Firm*—Miles & Stockbridge P.C.

(57) ABSTRACT

This invention provides a semiconductor memory device with enhanced speed performance or enabling timing adjustment reflected in characteristic variation of memory cells, adapted to suppress an increase in the number of circuit elements. A write dummy bit section comprises a first dummy line and a second dummy line corresponding to complementary bit lines and a plurality of first dummy cells formed to be similar in shape to static memory cells, wherein a write current path is coupled between the first dummy line and the second dummy line. In the write dummy bit section, one voltage level is input to the first dummy line through driver MOSFETs in relation to write signal inputs to the static memory cells and a signal change in the second dummy line precharged at the other voltage level is sensed and output. A timing control circuit deselects a word line selected by an output signal from the write dummy bit section.

16 Claims, 22 Drawing Sheets

CSRAM

9M ARRAY

READ CYCLE

WRITE CYCLE

READ CYCLE

WRITE CYCLE

US 7,656,733 B2

SEMICONDUCTOR MEMORY DEVICE

CROSS-REFERENCE TO RELATED APPLICATIONS

The disclosure of Japanese Patent Application No. 2007-116379 filed on Apr. 26, 2007 including the specification, drawings and abstract is incorporated herein by reference in its entirety.

BACKGROUND OF THE INVENTION

This invention relates to a semiconductor memory device and relates to a technique that is effectively used for static RAMs in which high speed write and read operations are primarily performed.

Japanese Patent Application Laid-Open No. 2006-004463 relates to a static RAM arranged to detect a write delay by using write dummy cells and/or detect a read delay by using read dummy cells and terminate a write operation and/or a read operation.

[Patent Document 1]

Japanese Patent Application Laid-Open No. 2006-004463

SUMMARY OF THE INVENTION

In Patent Document 1, a transmission delay of a write enable signal is substituted by a delay involved in driving a dummy word line and a delay involved in writing to a memory cell by a write circuit is executed by a timing adjustment circuit. The timing adjustment circuit is comprised of dummy cells (MOSFETs 6) in which the ability to drive dummy bit lines corresponding to bit lines is equal to the ability to drive the bit lines of the write circuit. To the dummy word line, memory cells equivalent to memory cells coupled to a word line are coupled for substituting the transmission delay. Similarly, a dummy cell cluster is coupled to a dummy bit line so that the dummy bit line has the same load capacity as the bit line. In this way, many memory cells are coupled to the dummy word line and dummy bit line only for the purpose of making their parasitic capacity equivalent to the parasitic capacity of the word line and bit line. It is described that, to make it adaptive to characteristic variation per memory cell, a number of timing adjustment circuits like the one shown in FIG. 7 are provided and, among delays generated by these circuits, a largest delay is selected as a detection signal. For reading operation, a read dummy word line, dummy cells, a dummy bit line, similar to the above, are provided in the timing adjustment circuit.

By using smaller elements, the memory capacity increases. With an increase in the number of memory cells coupled to one word line and bit line, the time required for selecting a memory cell becomes longer. Thus, it is a mainstream to speed up this selection by using memory mats in which the number of memory cells coupled to one word line and bit line is restricted to about 256×256. For example, to realize a memory capacity such as several tens of Mbits, the number of the memory mats which are minimum selection units becomes about one thousand. Therefore, in the SRAM arrangement of Patent Document 1, to implement the write and read timing adjustments, a huge number of the write dummy word lines, read dummy word lines and dummy bit lines are needed. This SRAM arrangement has a problem in which, in particular, to make it adaptive to characteristic variation of memory cells, the SRAM requires even a greater number of dummy bit lines.

With smaller elements used, variation in characteristics of memory cells in one memory chip tends to become large. In Patent Document 1, there is no description about some measures to relate variation in the memory cell characteristics to variation in the ability of driving the dummy cells 6. Therefore, it is questionable that the implementation of timing adjustment with regard to the ability of driving the dummy cells 6 functions to compensate characteristic variation of the memory cells. The timing adjustment in which a delay corresponding to the lowest ability of driving the dummy cells is selected is not effective for memory access in sync with an externally input clock cycle. That is, even if timing to terminate selecting a word line is delayed by the above timing adjustment in the RAM internal circuit, an address signal, a write signal and others for next memory cycle are input in sync with the above clock regardless of such delay. In consequence, delayed timing to terminate the current memory cycle by the timing adjustment as above overlaps the next memory cycle and an error occurs in the next memory cycle.

It is an object of this invention to provide a semiconductor memory device with enhanced speed performance, adapted to suppress an increase in the number of circuit elements. It is another object of this invention to provide a semiconductor memory device enabling timing adjustment reflected in characteristic variation of memory cells, adapted to suppress an increase in the number of circuit elements. The above-noted objects and other objects and novel features of the invention will become apparent from the description of the present specification and the accompanying drawings.

One embodiment which is disclosed in the present application is as follows. A plurality of static memory cells are provided at the intersections of a plurality of word lines and a plurality of complementary bit lines. A write dummy bit section is provided that includes a first dummy line and a second dummy line corresponding to the complementary bit lines and a plurality of first dummy cells. In the write dummy bit section, one voltage level is input to the first dummy line through MOSFETs which have a driving ability equivalent to a write circuit that conveys a write signal to the complementary bit lines in relation to write signal inputs to the static memory cells, and the second dummy line precharged at the other voltage level through a write current path senses and outputs a signal change in accordance with the one voltage level of the first dummy line. A timing control circuit deselects a word line selected by an output signal from the write dummy bit section.

Another embodiment which is disclosed in the present application is as follows. A plurality of static memory cells are provided at the intersections of a plurality of word lines and a plurality of complementary bit lines. A read dummy bit section is provided that includes a third dummy line and a fourth dummy line corresponding to the complementary bit lines and a plurality of second dummy cells formed to be similar in shape to the static memory cells. In the read dummy bit section, the second dummy cells are selected via the first dummy line in response to a word line selection operation and a low level read current path of the second dummy cells is coupled to the fourth dummy line and senses and outputs change to low level of the fourth dummy line precharged at high level. The timing control circuit generates a timing signal to deselect a word line selected by an output signal from the read dummy bit section.

A further embodiment which is disclosed in the present application is as follows. A read dummy bit section and a write dummy bit section are provided and the timing control circuit deselects word lines selected, respectively, by output signals from the read dummy bit section and the write dummy bit section.

Dummy cells having characteristics reflecting characteristic variation of memory cells can be achieved, as a plurality of read current paths and write current paths are formed, using elements formed to be similar in shape to the memory cells. Circuit simplification can be achieved, as only the signal lines corresponding to the complementary bit lines are coupled to the dummy cells. Because a plurality of dummy cells are coupled in parallel, average characteristics of the memory cells are simulated. In advance of reading and writing of the memory cells, a signal change is introduced in the dummy bit line and detected. Thus, consistency between the detection output signal and the operation of reading and writing of the memory cells can be improved.

DETAILED DESCRIPTION OF THE PREFERRED EMBODIMENTS

Figure 3:
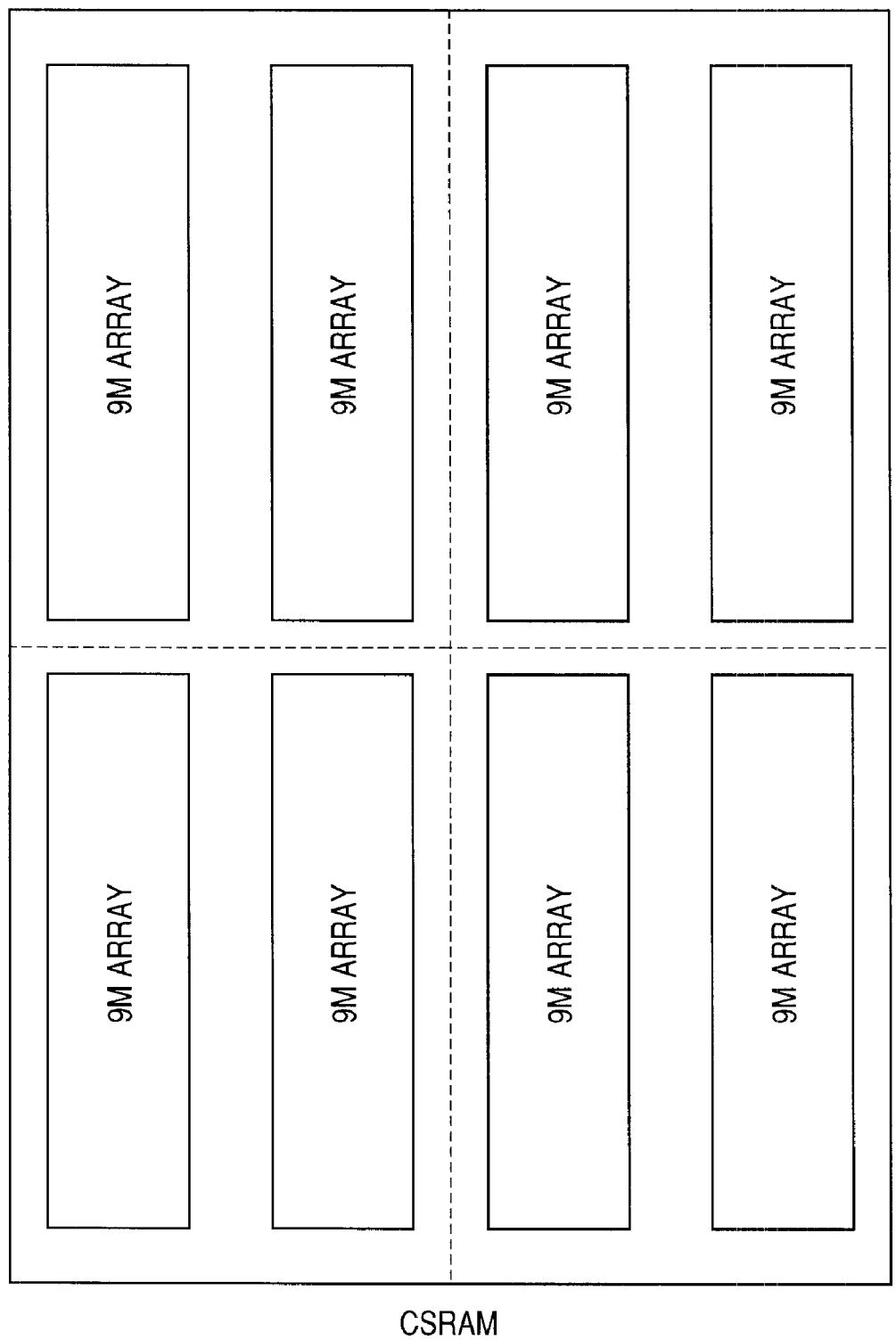
FIG. 3 is a whole block diagram showing an embodiment of an SRAM according to this invention.

FIG. 3 shows a whole block diagram of an embodiment of an SRAM according to this invention. In FIG. 3, a layout of blocks is shown corresponding to their actual geometrical arrangement on a semiconductor chip. The semiconductor chip is divided into four areas, as indicated by dotted lines in the figure, the division being made by an address input circuit region extending lengthwise in the horizontal center and an indirect logic region extending crosswise in the vertical center. Although not restrictive, these four areas each have identical memory arrays and address/data logic regions. One area is divided into two arrays (9M arrays) in right and left positions. One array has a storage capacity of about 9 Mbits and, therefore, the whole chip has a storage capacity of 72 Mbits (9 Mbits×8).

Figure 4:
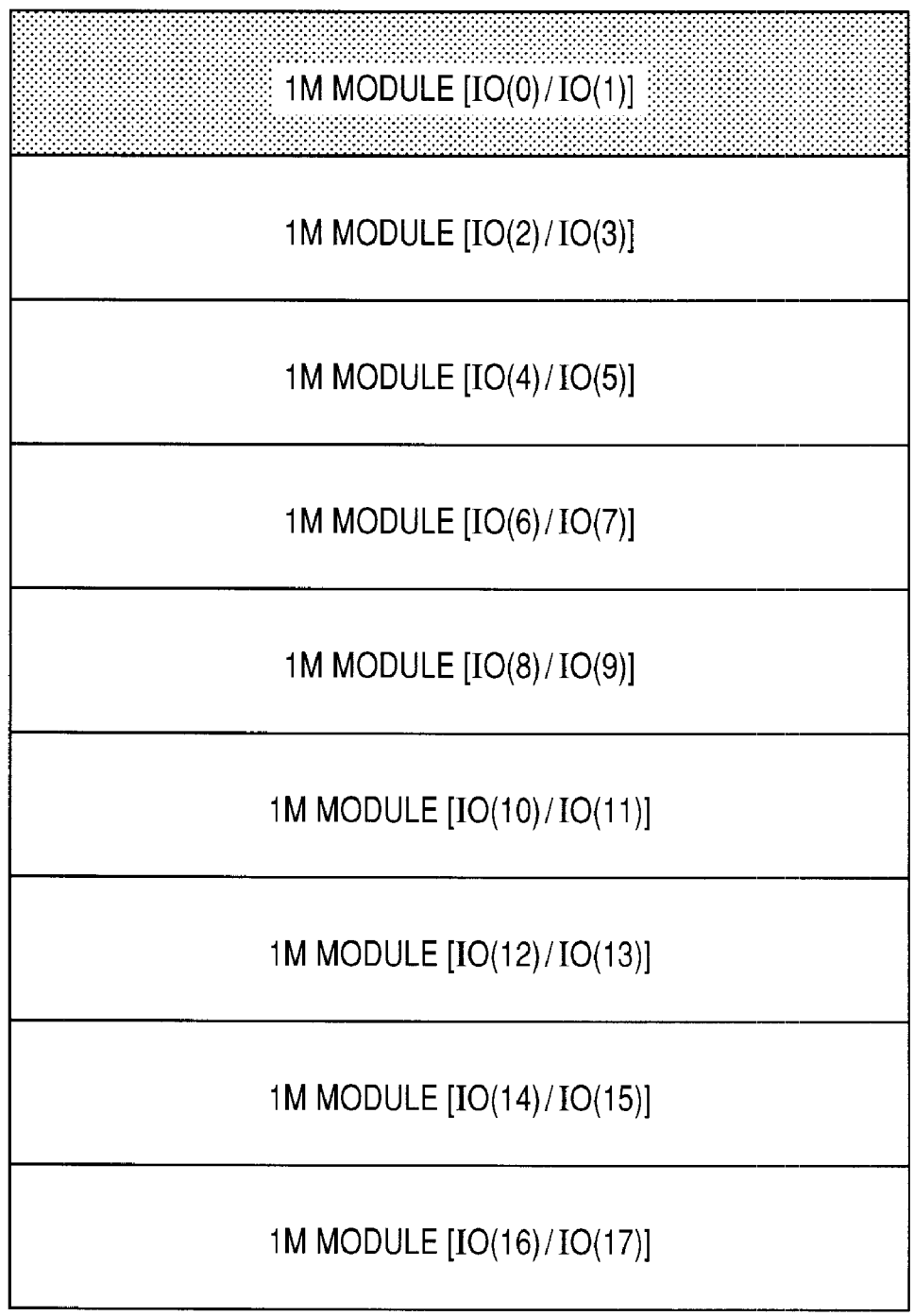
FIG. 4 is a detailed block diagram of one array from FIG. 3.

FIG. 4 shows a detailed block diagram of one array from FIG. 3. One array (9M array) is divided into nine modules (1M modules) arranged in a lengthwise direction of FIG. 4 (also true for FIG. 2). Each module (1M module) is assigned two bit data input/output (I/O(0), I/O(1) through I/O(16), I/O(17)). To one of the four areas shown in FIG. 3, two arrays (9M arrays) are allocated at both sides of an address/data bus logic region extending lengthwise in the horizontal center of the area. The address/data bus logic region selects one of the two arrays (9M arrays) at both sides thereof. Therefore, the SRAM of this embodiment allows writing and reading of data of 2×9 bits in parallel to/from each array. If an operating mode in which four arrays are selected simultaneously is set or such setting is done with a memory select circuit, input and output of 72 bits of data can be performed. If an operating mode in which only one of the four arrays is selected is set or such setting is done with the memory select circuit, input and output of 18 bits of data can be performed.

Figure 5:
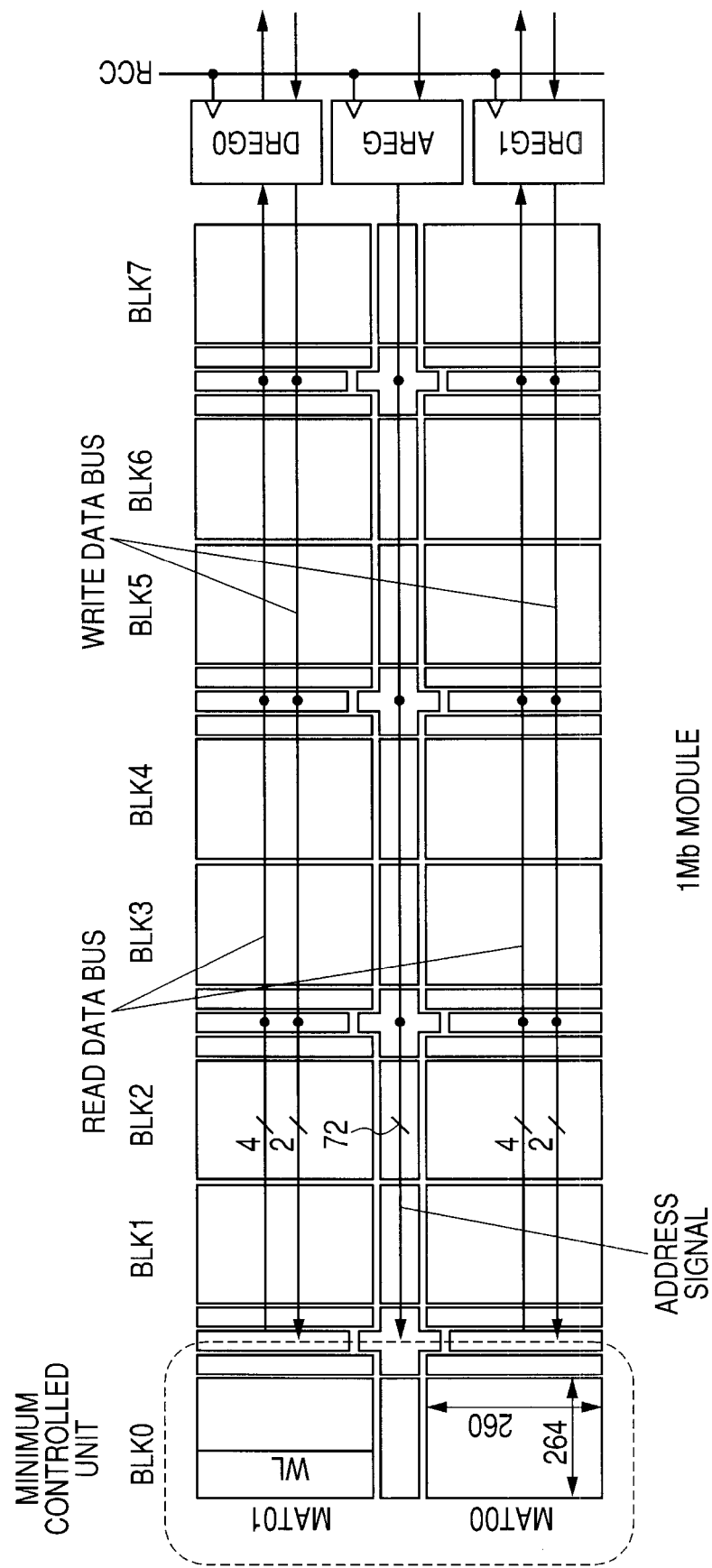
FIG. 5 is a diagram depicting an arrangement of memory mats to explain one module from FIG. 4.

FIG. 5 shows a diagram depicting an arrangement of memory mats to explain one module (1M module) from FIG. 4. The vertical and horizontal directions in FIG. 5 are opposite to those in FIG. 3. Thus, a module (1M module) shown in FIG. 5 corresponds to one module in FIG. 4 rotated by 90 degrees. In FIG. 5, the module (1M module) is divided into two parts horizontally (vertically in FIG. 4). The module is further divided into memory blocks of BLK0 to BLK7 vertically (horizontally in FIG. 4). A memory block BLK0 which is shown as exemplary one is divided, as mentioned above, into two memory mats MAT00, MAT01 which are minimum controlled units. Thus, there are 16 (2×8) memory mats which are minimum controlled units per module (1M module). Since one array contains nine modules, 144 (16×9) memory mats are provided in one array. Since there are eight arrays in the whole chip, 1152 (144×8) memory mats are provided.

Two memory mats MAT00, MAT01 provided in the above memory block BLK0 and two memory blocks in its adjacent memory block BLK1 are combined into one set and a timing control circuit is installed in the center of this set of blocks. The above address/data bus logic region exists adjacently to a memory block BLK7 and this region includes an address register AREG and data registers DREG0, 1. To the address register AREG, an address signal is delivered through a signal bus extending in the center of the module. Across the memory mats of the above memory blocks BLK1 to BLK7, a write data bus carrying write signals and a read data bus carrying read signals extend, piercing through these mats.

One memory mat, e.g., MAT00 is comprised of 264 word lines and 260 pairs of complementary bit lines. Among these, regular word lines are 256 lines and regular complementary bit lines are 256 pairs. The remaining word lines and complementary bit lines are intended for redundancy purposes and used for relief in case a fault occurred in the regular word lines and complementary bit lines. In this embodiment, in each memory mat like the above memory mats MAT0 and MAT1, a write dummy bit section and a read dummy bit section are formed, utilizing a pair of complementary bit lines provided in each memory mat.

Figure 6:
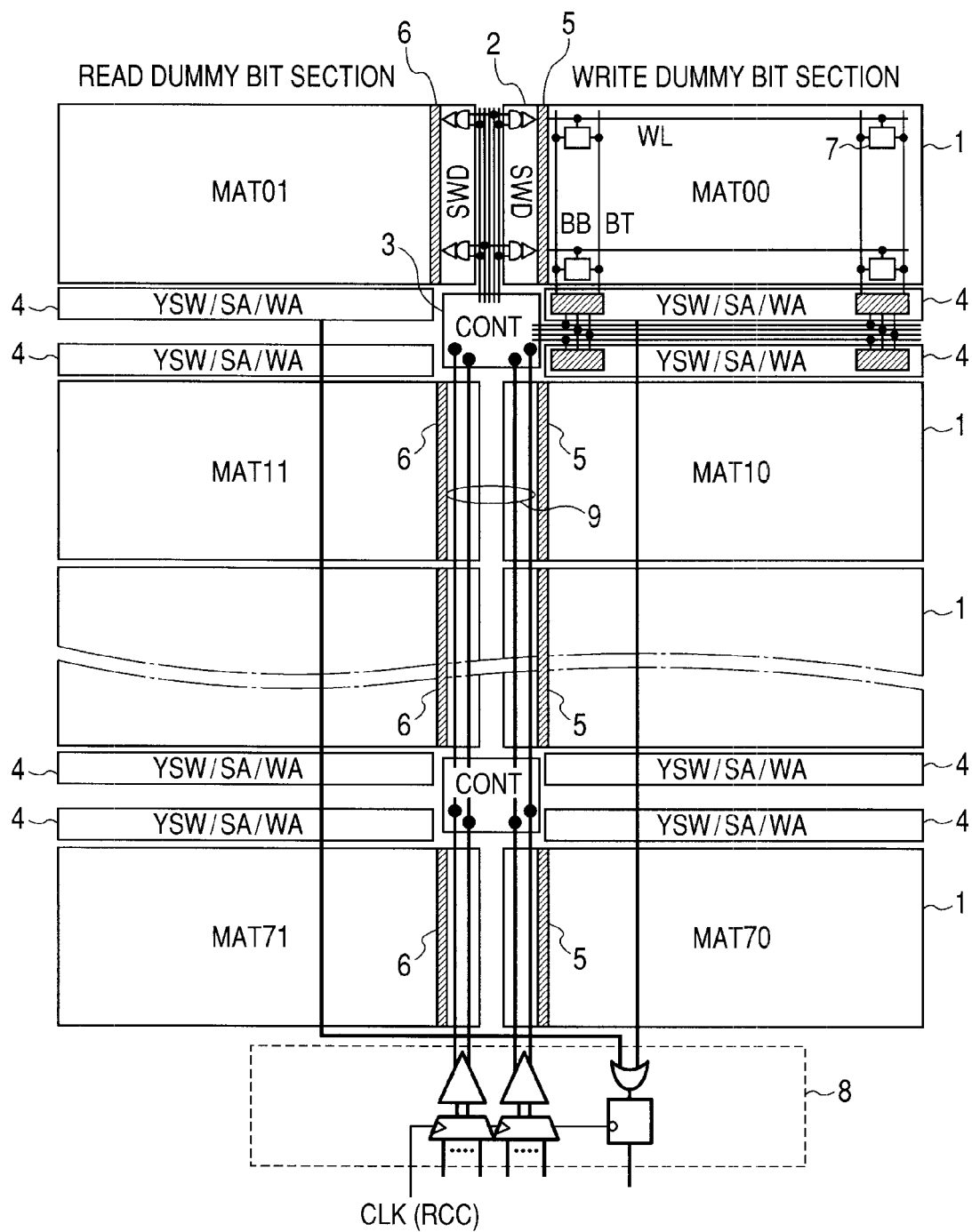
FIG. 6 is a diagram depicting an arrangement of memory mats to explain one module from FIG. 4 in greater detail.

FIG. 6 shows a diagram depicting an arrangement of memory mats to explain one module (1M module) from FIG. 4 in greater detail. The memory mats MAT00 and MAT01 which are shown as representative exemplary ones have word line select circuits SWD for selecting word lines WL. These word line select circuits SWD are installed such that they are adjacent to each other. As shown in FIG. 5, a signal bus 9 including address signal lines extends between the memory mats MAT00 and MAT01. Due to that the signal lines carrying X-coordinate and Y-coordinate address signals run in parallel with and near the memory mats which are minimum controlled units, it is possible to reduce a skew between X-coordinate address and Y-coordinate address and thus reduce a delay in memory selection caused by such skew.

A word line select circuit is comprised of: a decoding circuit that receives an address signal from the above address signal line through a control circuit which will be described later, decodes the address signal, and generates a signal for selecting one word line; and a word line driving circuit that amplifies that signal and drives the word line WL. In the above memory mat MAT00, a write dummy bit section is provided, utilizing a pair of complementary bit lines adjacent to the above address select circuit. In the other memory mat MAT01, a read dummy bit section is provided, utilizing a pair of complementary bit lines adjacent to the above address select circuit.

Four memory mats, the memory mats MAT00, MAT01 and their adjacent memory mats MAT10, MAT1 in the above memory block BLK0 are combined in a set. There is a timing control circuit CONT in the center of the set of these for memory mats 00, 01 and 10, 11. Between the memory mat MAT00 and the memory mat MAT10, column select circuits YSW, sense amplifiers SA, and write amplifiers WA are installed, which are responsible for the memory mats MAT00 and MAT10, respectively. Between these two sets of column select circuits YSW, sense amplifiers SA, and write amplifiers WA, a data bus or the like and select circuits for selecting either of the column select circuits YSW, sense amplifiers SA, and write amplifiers WA are installed and linked to the above write data bus extending vertically and the read data bus carrying read signals.

In FIG. 6, the memory mat MAT00 and others are denoted by reference numeral 1 for consistency with further description. Reference numeral 3 denotes a timing control circuit CONT. Reference numeral 4 denotes each set of column select circuits YSW, sense amplifiers SA, and write amplifiers WA which are responsible for the memory mats, respectively. Reference numeral 5 denotes a write dummy bit section. Reference numeral 6 denotes a read dummy bit section. Reference numeral 7 denotes a memory cell (MC). Reference numeral 8 denotes a section including the above registers and drivers in the above address/data bus logic region. Reference numeral 9 denotes a signal bus including address signal lines.

In this embodiment, one memory mat per module is selected and conducted to the above registers and the like in the above address/data bus logic region. For this reason, it does not happen that select both memory mats such as MAT00, MAT01 at the right and left sides of the address select circuit 2 are selected at the same time. Hence, allocating a write dummy bit section to one memory mat MAT00 and allocating a read dummy bit section to the other memory mat MAT01 will cause no problem. Accordingly, when the memory mat MAT00 has been selected, the write dummy bit section in the memory mat MAT00 and the read dummy bit section in the memory mat MAT01 not selected can be used. Inversely, when the memory mat MAT01 has been selected, the read dummy bit section in the memory mat MAT01 and the write dummy bit section in the memory mat MAT00 not selected can be used. Adopting such a configuration can facilitate circuit simplification greatly as compared with the configuration known from Patent Document 1 as mentioned before.

In this embodiment, as described above, the write dummy bit section and the read dummy bit section are placed adjacently to the address select circuit between adjacent mats and the timing control circuit is provided in the above mat circuit. Accordingly, the timing control circuit that controls the operations of the write dummy bit section and read dummy bit section can be formed to provide a common control of these sections and, moreover, wiring for connection is easy.

In this embodiment, as described above, the write dummy bit section or read dummy bit section of a memory mat not selected is used and, consequently, there are no dummy word lines which are used in the SRAM known from Patent Document 1. In the read dummy bit section 6, one of a pair of complementary bit lines as mentioned above is used as a dummy bit line and the other is used as a dummy cell select line. In the write dummy bit section, one of a pair of the complementary bit lines as mentioned above is used as a dummy bit output line and the other is used as a dummy bit input line. In this way, dummy word lines are dispensed with and, therefore, e.g., dummy cells and select circuits coupled to these lines are dispensed with. This enables circuit simplification to a great extent in comparison with the configuration known from Patent Document 1 as mentioned before. Particularly, in an SRAM structure having a great number of memory mats such as 1152 mats as mentioned above, the advantages of the invention of the present application, i.e., the dummy word lines are dispensed with and only a dummy circuit using one complementary bit line is needed in one memory mat, produce a great difference in circuit scale of the whole memory chip.

Figure 7:
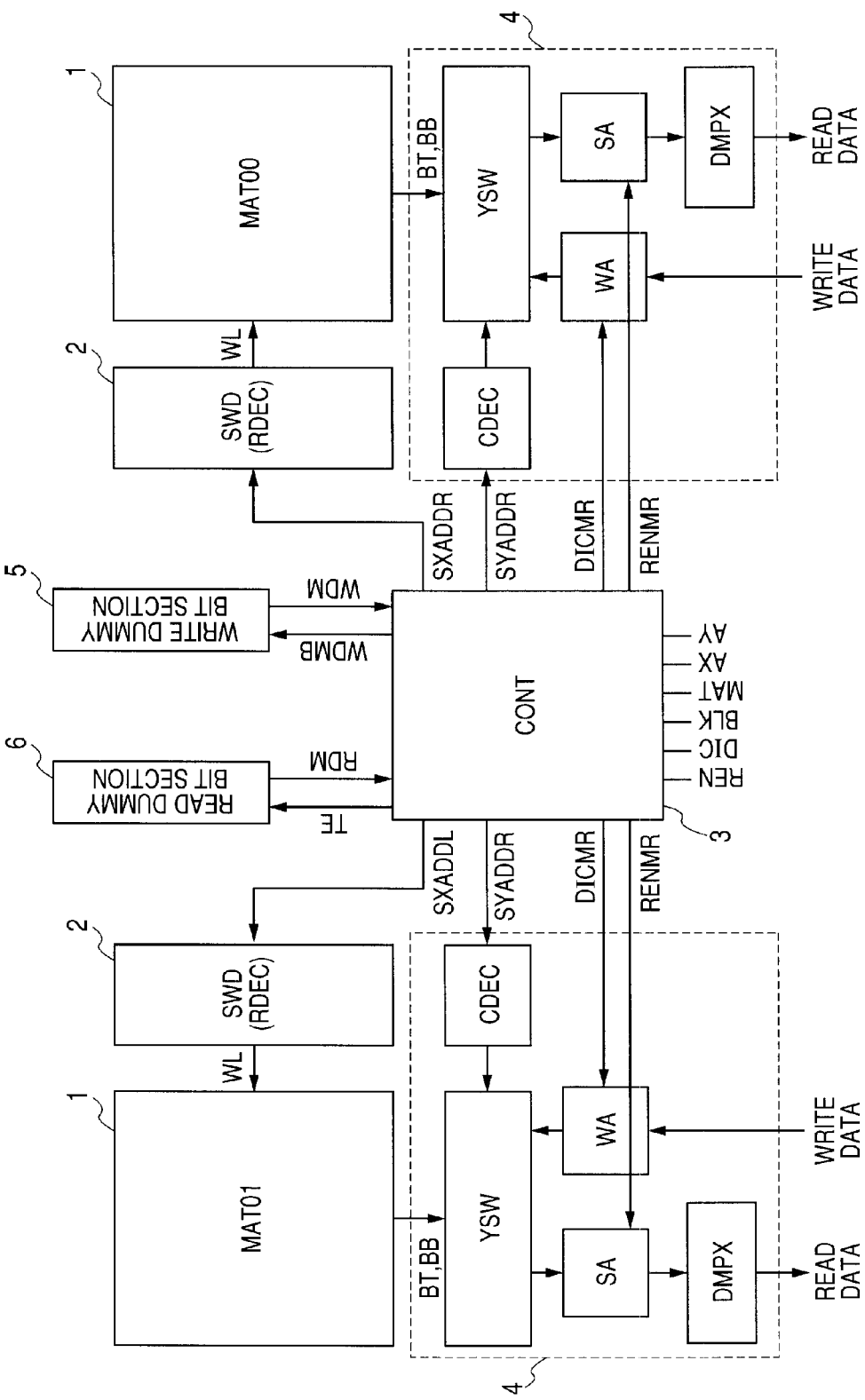
FIG. 7 is a block diagram to explain a relationship between two memory mats and a control circuit from FIG. 6.

FIG. 7 shows a block diagram to explain a relationship between two memory mats and a control circuit from FIG. 6. In this figure, memory mats 1 (MAT00 and MAT01) and a control circuit 3 (CONT) are shown as representative exemplary ones. A word line of the memory mat 1 (MAT00) is selected by the address select circuit 2. The address select circuit 2 (SWD+RDEC) is supplied with an X-coordinate address signal SXADDR via the control circuit 3 (CONT), decodes the address signal with an X-coordinate decoder RDEC, and generates a signal for selecting the word line WL in a word line driving circuit. Complementary bit lines BT, BB of the memory mat 1 (MAT00) are selected by the column select circuit YSW included in the above circuit 4 (YSW/SA/WA). The column select circuit YSW is selected by a column decoder CDEC and makes the complementary bit lines BT, BB of the memory mat 1 (MAT00) couple to an output terminal of the write amplifier WA or an input terminal of the sense amplifier SA. The column decoder CDEC is supplied with a Y-coordinate address signal SYADDR via the control circuit 3 (CONT), decodes the address signal, and generates a signal for selecting the above column select circuit YSW. The write amplifier WA is operated by a control signal DICMR and the sense amplifier SA is operated by a control signal RENMR. A data multiplexer DMAX selects and outputs a read signal amplified by the sense amplifier SA. The same circuits as described above are provided in the memory mat 1 (MAT01) as well.

The control circuit 3 (CONT) receives an X-coordinate address signal AX which is used for selecting the above word line, a Y-coordinate address signal AY which is used for selecting the complementary bit lines, a mat select signal Mat, a block select signal BLK, a write control signal DIC, and a read control signal REN, and supplies the address signals as mentioned above to the above memory mat 1 (MAT00, MAT01) and others and generates control signals for the write amplifier WA and the sense amplifier SA, an input signal WDMB to the write dummy bit section 5, and a select signal TE to the read dummy bit section 6. During a write operation, when the above control circuit 3 (CONT) receives an output signal WDM in response to the above input signal WDMB from the write dummy bit section 5, it terminates the write operation. During a read operation, when the above control circuit 3 (CONT) receives an output signal RDM in response to the above select signal TE from the read dummy bit section 6, it terminates the read operation. For termination, the control unit deselects the selected word line of the above memory mat 1 (MAT00, MAT01) and performs equalization of the complementary bit lines.

Figure 8:
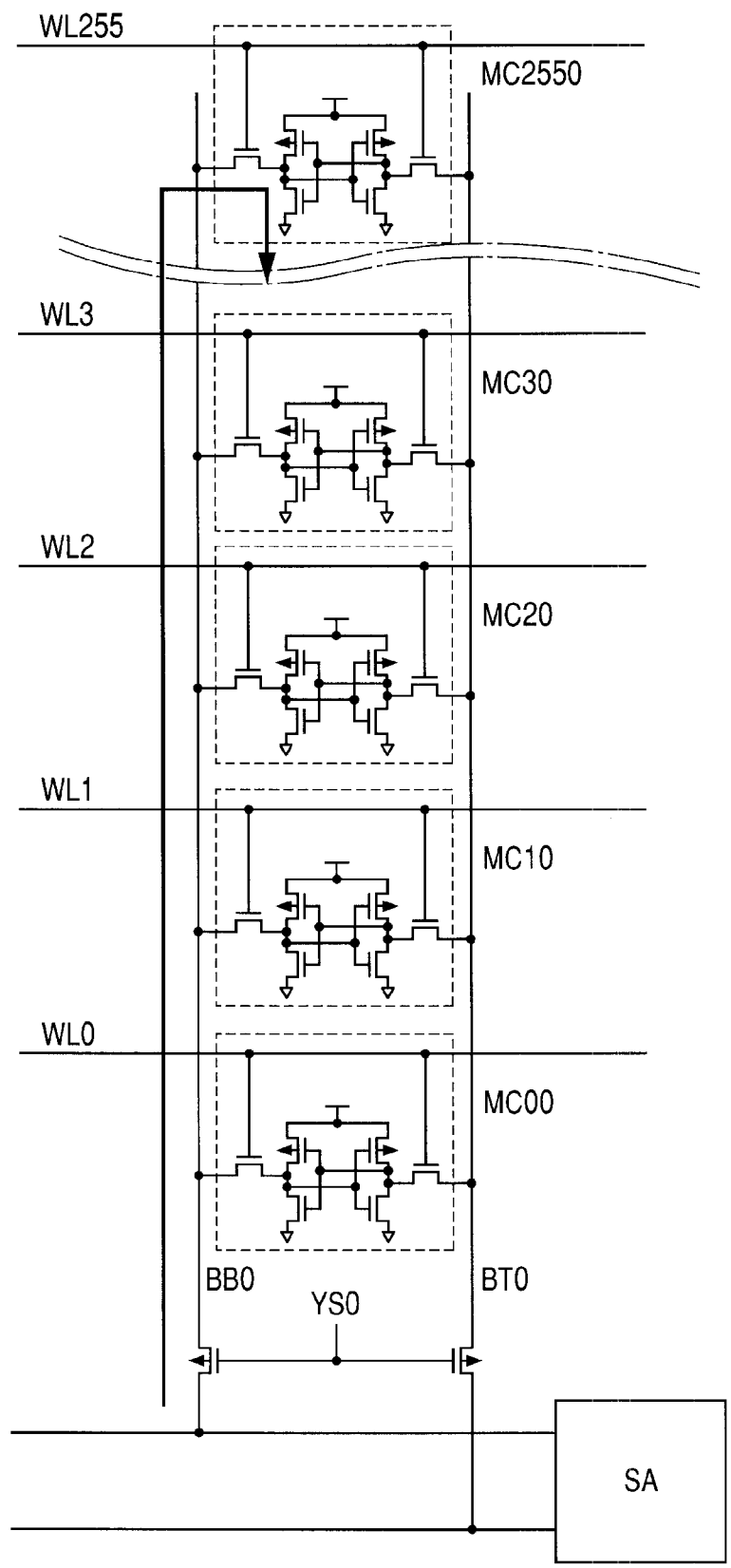
FIG. 8 is a circuit diagram to explain a reading path from a memory mat.
Figure 10A:
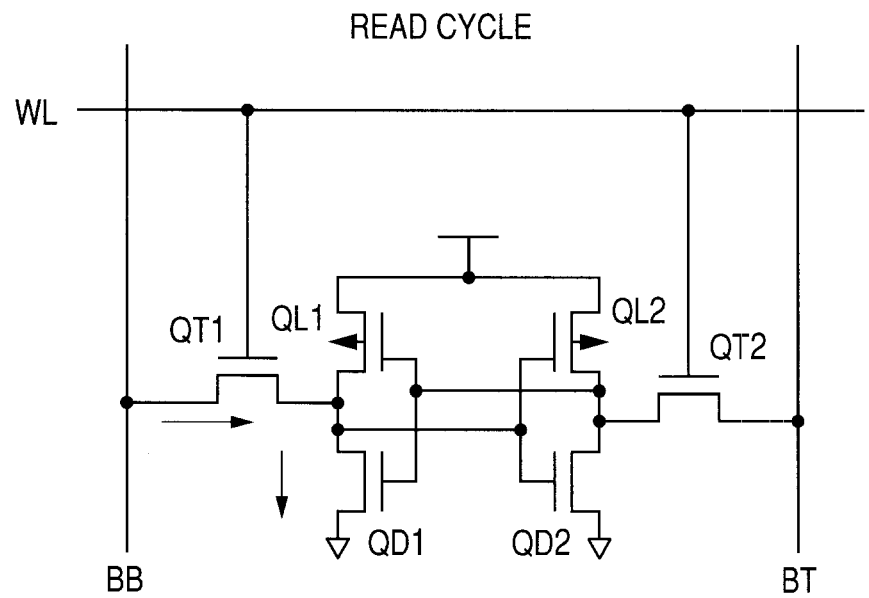
FIGS. 10A and 10B are circuit diagrams to explain memory cell operations in a read cycle and a write cycle.

FIG. 8 shows a circuit diagram to explain a reading path from the memory mat. This figure depicts a state where a word line WL255 as a representative is selected and complementary bit lines BB0, BT0 are selected by a column switch. In a memory cell, as is shown in FIG. 10A, a driver MOSFET QD1 for one bit line BB is on and a driver MOSFET QD2 for the other bit line BT is off. Hence, a p-channel load MOSFET QL1 is off and a p-channel load MOSFET QL2 is on. By selecting the word line WL, address selector MOSFETS QT1, QT2 are turned on.

In FIG. 8, with respect to the above bit line BB0 precharged by a precharge circuit not shown, a current path for discharging the precharged voltage of the bit line BB0 is formed via the address selector MOSFET QT1 made on by the above word line WL 255, shown in FIG. 10A, and the above driver MOSFET QD1 which is on. For the bit line BT, a current path for discharge is not formed, because the driver MOSFET QD2 for the bit line BT is off, even though the address selector MOSFET QT2 is on due to the voltage level of the selected word line WL 255. Consequently, the complementary bit line BT remains at a high level of precharged voltage. Because the complementary bit line BB0 is at a low level and BT0 at a high level, as noted above, a voltage level difference appears at the input terminal of the sense amplifier SA via the column switch and it is amplified by the sense amplifier SA.

Figure 9:
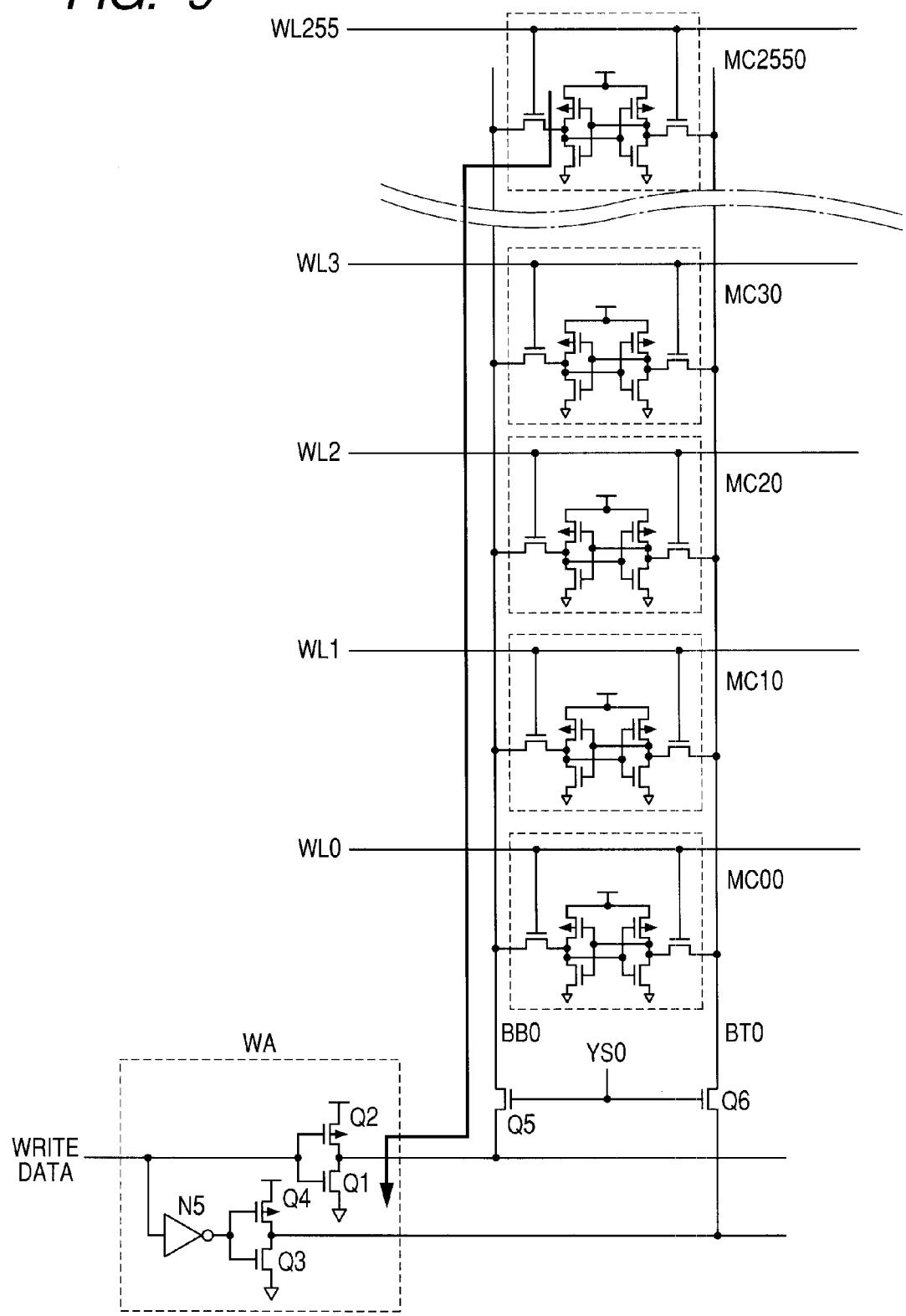
FIG. 9 is a circuit diagram to explain a writing path from a memory mat.
Figure 10B:
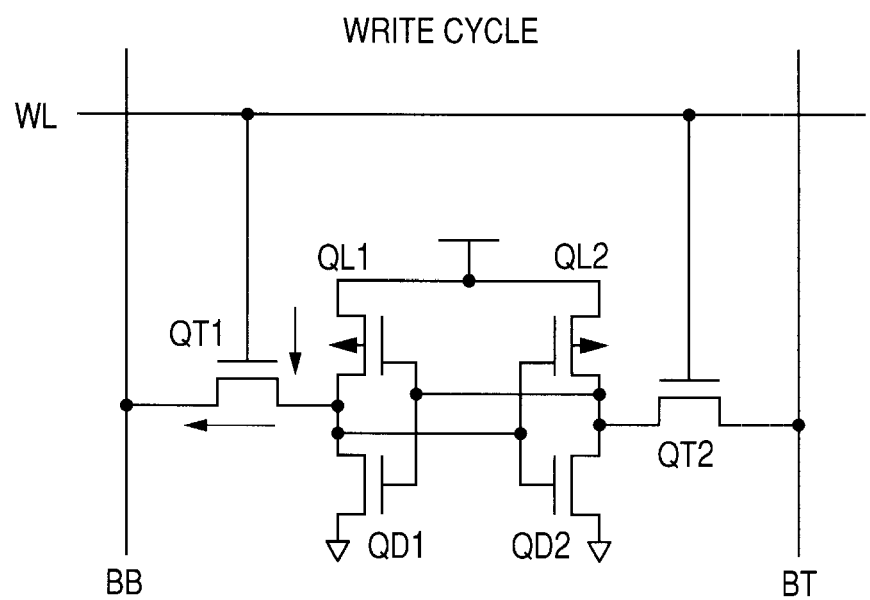

FIG. 9 shows a circuit diagram to explain a writing path from the memory mat. This figure depicts a state where a word line WL255 as a representative is selected and complementary bit lines BB0, BT0 are selected by a column switch. In a memory cell, as is shown in FIG. 10B, the driver MOSFET QD1 for one bit line BB is off and the driver MOSFET QD2 for the other bit line BT is on. Hence, the p-channel load MOSFET QL1 is on and the p-channel load MOSFET QL2 is off. By selecting the word line WL, address selector MOSFETS QT1, QT2 are turned on. FIG. 9 represents an example where writing is performed to invert the memory state of such a memory cell.

The voltage level of the selected word line WL255 makes the address selector MOSFET QT1 shown in FIG. 10B on. In FIG. 9, column switch MOSFETs Q5, Q6 are turned on by a column select signal YS0. When a MOSFET Q1 of the write amplifier WA is turned on, a current path is formed for discharging a memory node formed by the drain of MOSFETs QD1, QL1 coupled in common via the above column switch MOSFET Q5, the bit line BB, and the address selector MOSFET QT1 in the memory cell and the gate of the driver MOSFET QD2. At this time, the driver MOSFET QD1 for the bit line BB is off and the p-channel load MOSFET QL1 is on in the memory cell shown in FIG. 10B. Due to this, a current flows from the above p-channel load MOSFET QL1 to counteract the current for discharging the above node by a write current supplied by the above write amplifier WA. That is, the current acting to keep the memory state flows from the p-channel load MOSFET.

The current flowing from the above p-channel MOSFET QL1 is smaller than the current flowing through the MOSFET Q1 of the above write amplifier WA, or causes the discharge of the voltage of the above memory node to a low level. This discharge triggers decreasing the gate voltage of the driver MOSFET QD2 being on and increasing the gate voltage of the load MOSFET QL2 accordingly. In consequence, a positive feedback loop is produced in which the voltage of the driver MOSFET QD1 being off increases to act to facilitate the voltage fall of the above memory node, which in turn decreases the current flowing through the above driver MOSFET QD2, and the gate voltage of the above driver MOSFET QD1 is increased by the current flowing from the above load MOSFET QL2. At the same time, the current from the bit line BT through the address selector MOSFET QT2 acts to increase the gate voltage of the above driver MOSFET QD1 in reverse proportion to a decrease in the current through the above driver MOSFET QD2. Eventually, inversion occurs such that the driver MOSFET QD1 becomes on and the load MOSFET QL1 off, whereas the driver MOSFET QD2 becomes off and the load MOSFET QL2 on.

Figure 1:
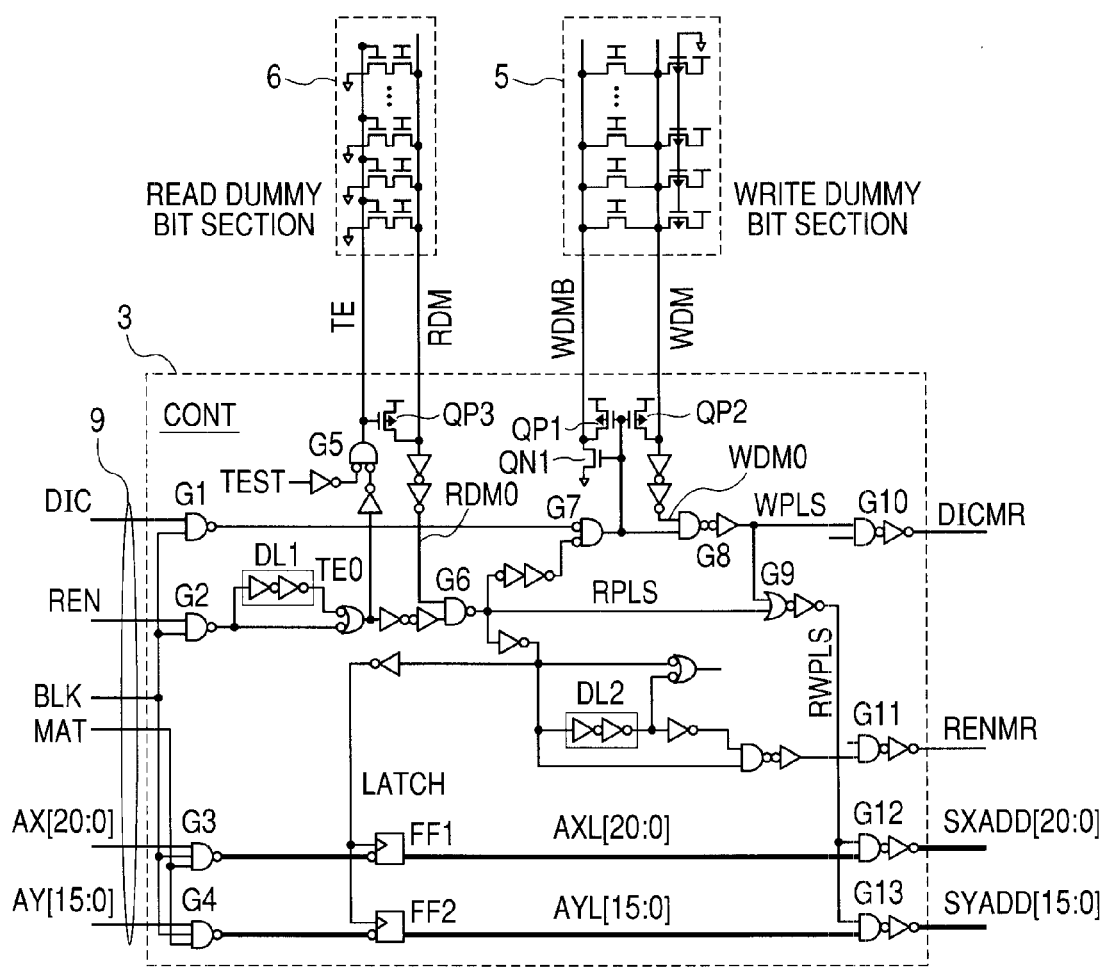
FIG. 1 is a circuit diagram showing an embodiment of dummy bit sections and a control circuit according to this invention.

FIG. 1 shows a circuit diagram of an embodiment of dummy bit sections and a control circuit according to this invention. Reference numerals used in this figure correspond to those in FIG. 7. In the write dummy bit section 5, elements formed in the same manner as for the constituent elements of a memory cell shown in FIG. 10 are used as is. An input line for an input signal WDMB is formed by using wiring equivalent to one of the complementary bit lines of the memory mat MAT00, e.g., an inverting bit line BB. An output line for an output signal WDM is formed by using wiring equivalent to the other complementary bit line, a noninverting bit line BT.

Between the input line and the output line of the write dummy bit section shown in FIG. 1, a source-drain path of a MOSFET equivalent to an n-channel address selector MOSFET QT1 included in the memory cell shown in FIG. 10 is connected. The gate of this MOSFET QT1 is constantly coupled to a supply voltage so that the MOSFET remains on. Between the above output line and the supply voltage, a MOSFET equivalent to a p-channel load MOSFET QL1 included in the above memory cell is installed. That is, among six MOSFETS QD1, QD2, QL1, QL2, QT1, and QT2 included in the memory cell, those equivalent to the above two MOSFETS QT1 and QL1 are selected and coupled to the above input line and output line. A feature of the invention disclosed in the present application is that the above MOSFETs as many as those used in a plurality of memory cells are coupled in the same way as described above. That is, MOSFETs equivalent to the above MOSFETs QT1, QL1 as many as those used in the memory cells are, in parallel, coupled to the above input line and output line.

Like the above writing dummy bit section 6, in the read dummy bit section 6, elements formed in the same manner as for the constituent elements of a memory cell shown in FIG. 10 are used as is. A select line carrying a select signal TE is formed by using wiring equivalent to one of the complementary bit lines of the memory mat MAT00, e.g., an inverting bit line BB. An output line for an output signal RDM is formed by using wiring equivalent to the other complementary bit line, a noninverting bit line BT. Between the above output line and the ground potential of the circuit, source-drain paths of MOSFETs equivalent to the n-channel driver MOSFET QD1 and the address selector MOSFET QT1 included in the memory cell shown in FIG. 10 are connected in series. The gate of the MOSFET equivalent to the above address selector MOSFET QT1 is constantly coupled to the supply voltage so that the MOSFET remains on. The gate of the MOSFET equivalent to the above MOSFET QD1 is coupled to the above select line TE. That is, among the six MOSFETS QD1, QD2, QL1, QL2, QT1, and QT2 included in the memory cell, MOSFETs equivalent to the above two MOSFETS QT1 and QD1 are selected and coupled to the above select line and output line. A feature of the invention disclosed in the present application is that the above MOSFETs as many as those used in the memory cells are coupled in the same way as described above. That is, the above MOSFETs as many as those used in the memory cells are, in parallel, coupled to the above select line and output line.

An ordinary memory cell includes a plurality of cell transistors which are used for storing data and reading and writing. The cell transistors are coupled to another transistor among them, a supply voltage line, a ground line, a bit line, and a word line. Data cannot be written to the read and write dummy cells. These cells include the cell transistors used in an ordinary memory cell. How the transistors within a dummy cell are coupled each other differs from that in an ordinary memory cell. The shape of a dummy cell is similar to that of an ordinary cell. In most cases, the size of a dummy cell is usually the same as that of an ordinary cell. The same size is not always required, because the size may vary depending on cell boundary definition or the like. Because how the transistors in a dummy cell are coupled each other differs from that in an ordinary cell, different wiring and different shapes of connections and the like are often used in a dummy cell.

In the control circuit CONT (3) p-channel precharge MOSFETs QP1, QP2 for precharging the input line and output line of the above write dummy bit section 5 and a p-channel precharge MOSFET QP3 for precharging the output line of the above read dummy bit section 6 are provided. The select line of the above read dummy bit section 6 is connected to a logic gate circuit G2 that receives a read control signal REN and a block select signal BLK. When a read mode is determined by the logic gate circuit G2, a delay time in which a delay time in selecting a regular word line is taken into account is generated by an inverter chain DL1 and a select signal TE0 is generated. This signal TE0 is conveyed via a gate circuit G5 onto the above select line TE. The gate circuit G5 sets the above select signal TE in a selected state in relation to a test signal TEST also. A change in the output signal RDM through the above output line is detected by a detecting circuit comprised of two inverters chained and a detection signal RDM0 is generated. This signal RDM0 is conveyed to a gate circuit G6 and a read word reset signal RPLS is generated. This signal RPLS becomes a reset signal RWPLS for the word line via a gate circuit G9. This signal RWPLS controls gate circuits G12, G13 to stop the output of address signals SXADD[20:0], SYADD[15:0). Due to this, the selected word line is deselected.

The input line of the above write dummy bit section 5 is connected to a logic gate circuit G1 that receives a write control signal DIC and a block select signal BLK. When a write mode is determined by the logic gate circuit G1, a delay time in which a delay time in selecting a regular word line is taken into account is generated by an inverter chain DL1. A pulse RPLS corresponding to a write pulse is generated and an input signal WDMB is generated by driving a MOSFET N1 analogous to the MOSFET in the write amplifier WA. In the SRAM of this embodiment, reading is performed in the first half of one cycle of clock and writing is performed in the second half of the same cycle, as will be described later. Therefore, at the start of writing, the above read control signal REN is at a low level and the signal TE0 is at a high level accordingly. RDM is turned to a high level through the read dummy bit section 6 and it is determined that reading has terminated by gate circuits G6, G7.

By a high level output signal from the above gate circuit G7, an n-channel MOSFET QN1 in relation to the write amplifier WA is turned on and the input line WDMB is turned to a low level. The low level of the input line WDMB is conveyed via MOSFETs in the above dummy bit section to the output line WMD. That is, current flows through the same current path as in writing to the memory cell as shown in FIG. 10B, a change to a low level on the output line WDM0 in relation to the above memory node is detected by a detecting circuit comprised of two inverters chained, and a detection signal WDM0 is generated. By taking this signal WDM0, a gate circuit G8 generates a reset signal RWPLS for the write word line. This signal RWPLS becomes low level, after passing through a gate circuit G9. Again, the RWPLS signal controls the gate circuits G12, G13 to stop the output of address signals SXADD[20:0], SYADD[15:0]. Due to this, the selected word line is deselected.

Latch circuits FF1, FF2 take in address signals AX, AY, responsive to the above RPLS. That is, upon detection of that the memory mat has been selected by the above MAT and BLK, the take-in of the address signals AX, AY is performed. Responsive to the above signal WPLS, a signal DICMR (see FIG. 7) that activates the write amplifier WA is generated by a gate circuit G10. Responsive to the above signal RPLS, a signal RENR (see FIG. 7) that activates the sense amplifier SA is generated by a gate circuit G11.

Figure 2:
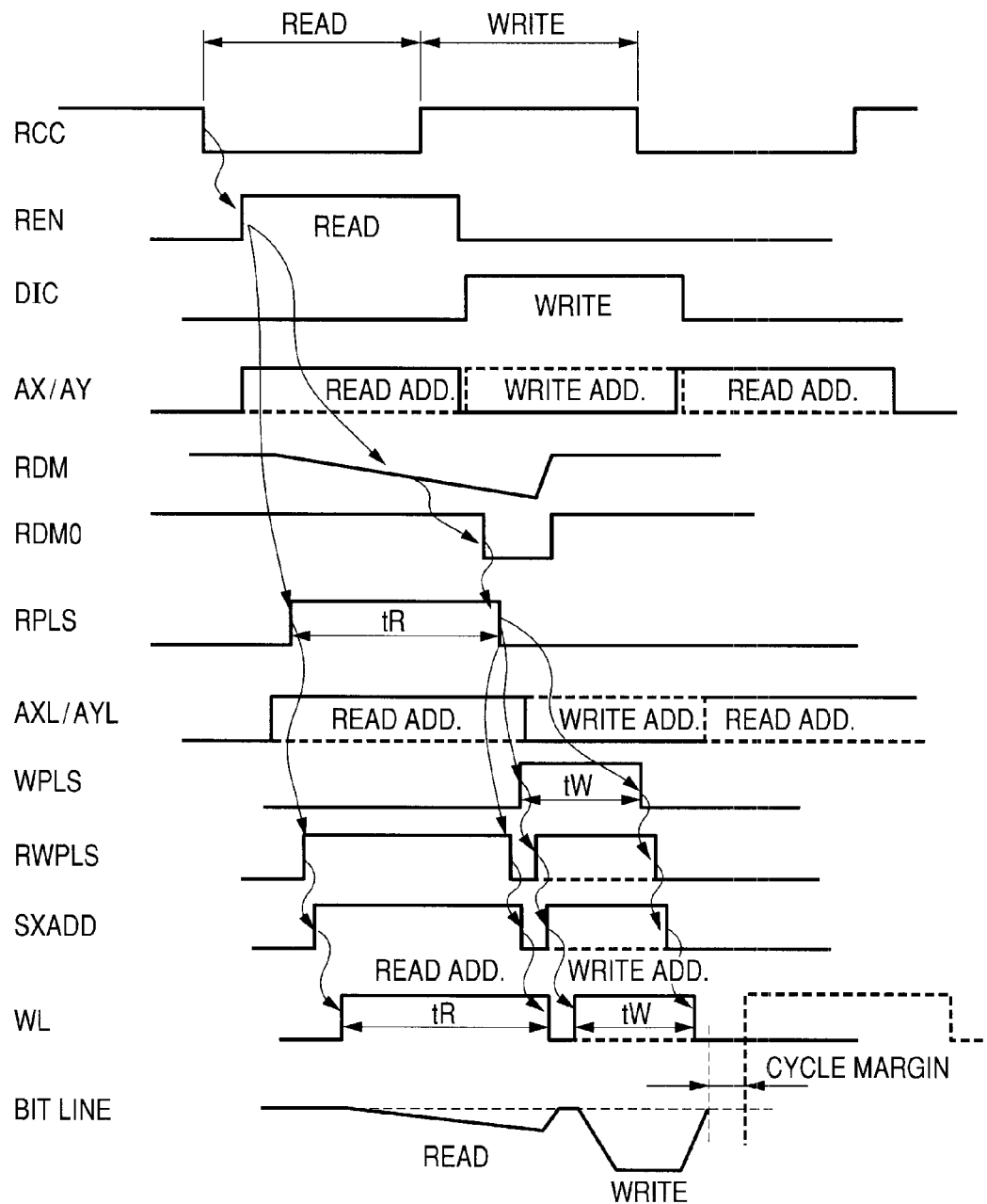
FIG. 2 is a waveform chart to explain the operations of the dummy bit sections and the control circuit in FIG. 1.

FIG. 2 shows a waveform chart to explain the operations of the dummy bit sections and the control circuit in FIG. 1. In this embodiment, a read mode corresponds to a first half cycle in which clock RCC is low level and a write mode corresponds to a second half cycle in which clock RCC is high level. Responsive to the above clock RCC, the read signal REN is turned to high level. In response to this, the PRLS signal is turned to high level, the address signal AX/AY in relation to the selected memory mat is taken in, and AXL/AYL is generated. Responsive to the change to high level of the above PRLS signal, the RWPLS signal is turned to high level and the word line WL related to the taken-in address signal is selected. A read signal Bit Line appears in the complementary bit lines (BT, BB).

In parallel with selection of the memory mat in relation to the word line WL selected, the select signal TE (not shown) is conveyed to the read dummy bit section 6. The RDM signal is output through the output line, RDM0 is turned to low level, which turns the PRLS signal to low level. In response to this, RWPLS is turned to low level, which resets the word line WL for reading to low level. At the same time, equalization of the complementary bit lines is performed.

In the second half cycle of clock RCC, the termination of reading is determined from the change to high level of the write signal DIC and the change to low level of the PRLS signal, and the WPLS signal is turned to high level. In response to this, an address signal for writing is taken in and the word line WL for writing is selected. A write signal Bit Line is conveyed onto the complementary bit lines (BT, BB).

In parallel with selection of the memory mat in relation to the word line WL selected, the write signal is conveyed onto the input line of the write dummy bit section 5 and, in response to a write detection signal WDM0 not shown, the WRLS signal is turned to low level. This turns RWPLS to low level and resets the word line WL for writing to low level. At the same time, equalization of the complementary bit lines is performed. There is a cycle margin between the end of equalizing the complementary bit lines and the start of the next read cycle.

In the SRAM memory of this embodiment, such specifications are assumed that memory cell reading is performed during the low level of the external clock RCC and memory cell writing is performed during the high level of the clock, as described above. A feature of the present embodiment resides in that each memory block includes the read dummy bit section and the write dummy bit section and the control circuit includes the latch circuits FF1, FF2 for holding the read address signal longer, if the read pulse RPLS is longer than the low level period of the clock RCC. Further, the pulse signal RPLS output from the read dummy bit section is input to the write dummy bit section to ensure that the write pulse WPLS just follows the read pulse RPLS, when reading and writing are continuously performed in the same memory array. According to this configuration, when reading and writing are performed continuously in the same memory array, it is possible to elongate the period of the read pulse RPLS, regardless of the duty of the external clock RCC, and read/write cycles at a higher rate can be achieved.

In the SRAM of this embodiment, when a memory array is selected by a BLK address signal and the read signal REN is selected, the select signal TE for the read dummy bit section is input to the dummy bit section. Because the dummy bit section is configured in the same form of a memory cell and a path corresponding to the read current path is used, the RDM signal with a pulse width depending on the performance of the memory cell transistors is returned to the control circuit 3. In the logic circuit section of the control circuit 3, an address signal is converted to a pulse width RPLS returned from the read dummy bit section and input to the row decoder RDEC and the column decoder CDEC explained with FIG. 7. The RDEC and CDEC decode each address signal into a word line select signal and a column select signal. The resulting word line select signal and column select signal can have the pulse width depending on the performance of the memory cell transistors, determined by the read dummy bit section.

As already described, for the read dummy bit section, when the dummy bit select signal TE is selected to high level, the output line RDM is pulled down to low level through the MOSFETs equivalent to access MOSFETs (QT) and driver MOSFETs (QD), included in the dummy bit section. A delay time from the change to high level of the signal TE until the change to low level of the output line RDM depends on the performance of the access MOSFETs (QT) and driver MOSFETs (QD). Hence, it is possible to acquire the detection signal RDM0 that reflects the reading performance of a regular bit memory cell in terms of the time taken for reading.

When a memory array is selected by a BLK address signal and the write signal DIC is selected, the select signal PRLS for the read dummy bit section is input to the write dummy bit section. A signal WMD with a pulse width depending on the performance of the memory cell transistors is returned to the control circuit 3 and a write pulse WPLS is generated. As in the case of reading, consequently, the word line select signal and column select signal can have the pulse width WPLS depending on the performance of the memory cell transistors, determined by the write dummy bit section.

As already described, when the write dummy bit select signal WDMB is turned to low level, the output line WDM is pulled down to low level through the access MOSFETs (QT) included in the write dummy bit section. A delay time until the change to low level of the output line WDM is determined by the percentage of load MOSFETs (QL) and access MOSFETs (QT) being on and this reflects the performance of the internal node in a regular bit memory cell in terms of time taken for inversion.

In this embodiment, the write dummy bit section employs the access MOSFETs and load MOSFETs as many as those used in a plurality of memory cells and the read dummy bit section employs the access MOSFETs and driver MOSFETs as many as those used in the memory cells. This means that a large current flows which is multiple times as much as the current flowing in actual regular memory cells. In other words, a multiplex current is produced into which all currents flowing in the memory cells are combined The detection signal is generated using such multiplied current. This produces an advantageous effect that a write pulse WPLS and a read pulse RPLS are generated from the above detection signal and, by using these pulses, it is possible to compensate a time delay until the word lines of regular memory cells are actually reset. That is, in advance of the operation of each memory cell, the detection signal reflecting the performance of the memory cell is generated and the word line of the memory cell is reset at nearly the same timing of the termination of the memory cell reading or writing. If, for the write dummy bit section and the read dummy bit section, a write pulse WPLS and a read pulse RPLS are generated using the same current that flows in memory cells, the word line remains selected longer until the word line is reset using either of these pulses and this results in a bottleneck in high-speed access.

Producing the multiplex current into which all currents flowing in the memory cells are combined has an advantageous effect that characteristic variations of the memory cells are absorbed. Even if, among the memory cells, there are some cells in which a large current flows and other cells in which only a small current flows, combining all currents flowing the memory cells into the multiplex current as above provides a possibility of obtaining an average memory cell current. That is, it is possible to generate a write pulse WPLS and a read pulse RPLS corresponding to an average performance of memory cells. A cell in which writing and reading cannot be performed by using such pulses WPLS and RPLS is rejected as a defective. If there is a cell in which writing or reading is impossible through a particular word line or bit line, such a defective memory cell should be replaced by a redundant circuit.

If a timing reference relies on one dummy element as a representative as in the case of the SRAM of Patent Document 1, timing adjustment only depends on the characteristic of one dummy element which may deviate from the average. Consequently, if timing adjustment is performed based on extremely short timing determined by the characteristic of the dummy element, most memory cells may be judged as errors even though they have no problem in their characteristics. Conversely, timing adjustment is performed based on extremely long timing determined by the characteristic of the dummy element, a problem that an error occurs when memory cells are operated in sync with an external clock with a short period may be encountered, even though they are normal as internal memory circuits. In the invention disclosed in the present application, it is possible to carry out memory timing control that is stable and has high reliability not depending on characteristic variation in dummy elements used for such timing adjustment. That is, in the SRAM of the embodiment disclosed in the present application, writing and reading for a period as designed are performed and a memory cell in which a writing or reading error occurs can be regarded as the one having a poor characteristic.

Figure 11:
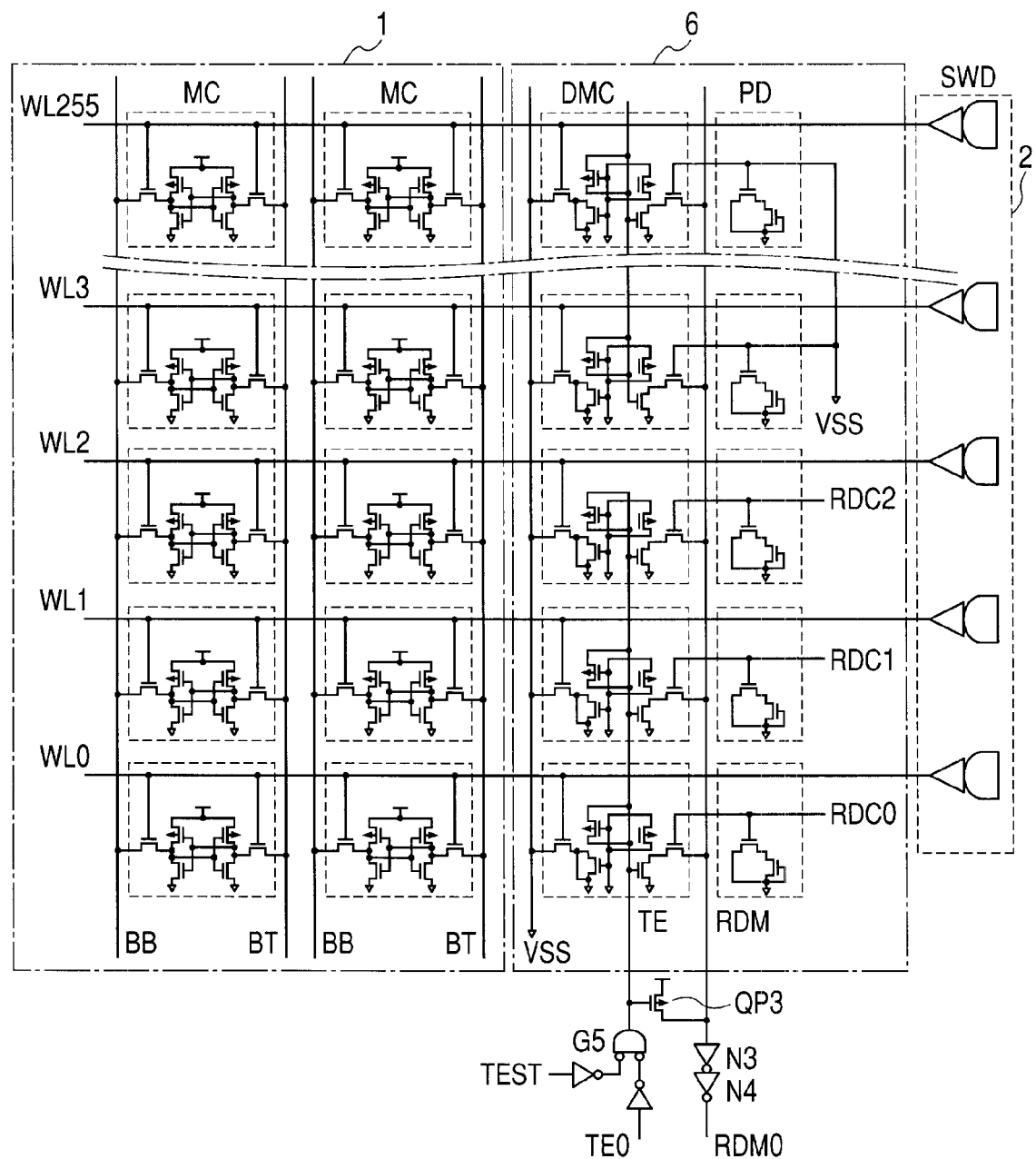
FIG. 11 is a circuit diagram showing an embodiment of a read dummy bit section and an associated memory mat.

FIG. 11 shows a circuit diagram of an embodiment of a read dummy bit section and an associated memory mat. In this embodiment, the number of dummy cells coupled to the output line RDM can be selected by select signals RDC0, RDC1, RDC2. This embodiment exemplifies that the number of dummy cells may be varied by the above select signals RDC0, RDC1, RDC2. This does not means that one dummy cell may only be used by selecting only one of the select signals RDC0, RDC1, RDC2. Among dummy cells DMC provided in the area in which the read dummy bit section 6 is formed, elements such as one related to the word line 255, which are not used for generating the above read pulse RPLS, are coupled t the output line RDM so that the parasitic capacity of the output line RDM becomes equal to the parasitic capacity of the bit line BT or the like. For MOSFETs provided to add a parasitic capacity, the gate of an n-channel MOSFET is coupled to the ground potential point, so that these MOSFETs remain off constantly. Further, pattern dummies PD are provided near the word line select circuit SWD so that the elements included in the read dummy bit section 6 have the same pattern dependency as the elements included in regular memory cells MC.

Figure 12:
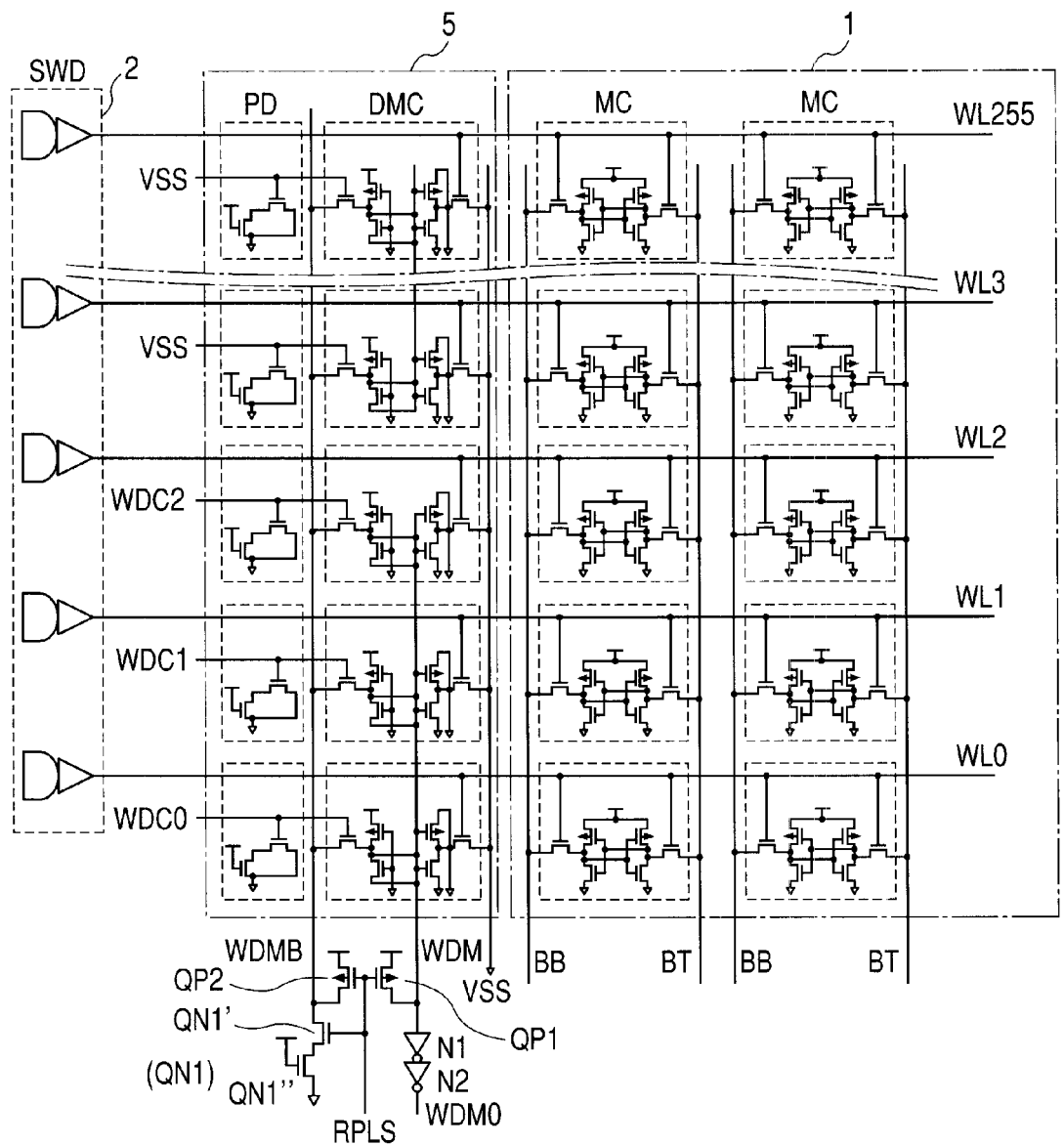
FIG. 12 is a circuit diagram showing an embodiment of a write dummy bit section and an associated memory mat.

FIG. 12 shows a circuit diagram of an embodiment of a write dummy bit section and an associated memory mat. In this embodiment, the number of dummy cells coupled to the output line WDM can be selected by select signals WDC0, WDC1, WDC2. This embodiment exemplifies that the number of dummy cells may be varied by the above select signals WDC0, WDC1, WDC2. This does not means that one dummy cell may only be used by selecting only one of the select signals WDC0, WDC1, WDC2. Among dummy cells DMC provided in the area in which the write dummy bit section 5 is formed, elements such as one related to the word line 255, which are not used for generating the above write pulse WPLS, are coupled to the output line WDM so that the parasitic capacity of the output line WDM becomes equal to the parasitic capacity of the bit line BT or the like. For MOSFETs provided to add a parasitic capacity, the gate of an n-channel MOSFET is coupled to the ground potential point, so that these MOSFETs remain off constantly. Further, pattern dummies PD are provided near the word line select circuit SWD so that the elements included in the write dummy bit section 5 have the same pattern dependency as the elements included in regular memory cells MC In this embodiment, a MOSFET QN1 in FIG. 1 is comprised of a serial circuit of MOSFETs QN1' and QN1". The MOSFET QN1' corresponds to the MOSFET Q1 in the write amplifier in FIG. 9 and the MOSFET QN1" corresponds to the MOSFET Q5 in the column switch in FIG. 9. In FIG. 1 and others, they are replaced by one MOSFET QN1. Therefore, the control circuit shown in FIG. 1 and others may include two MOSFETs QN1' and QN1".

Figure 13:
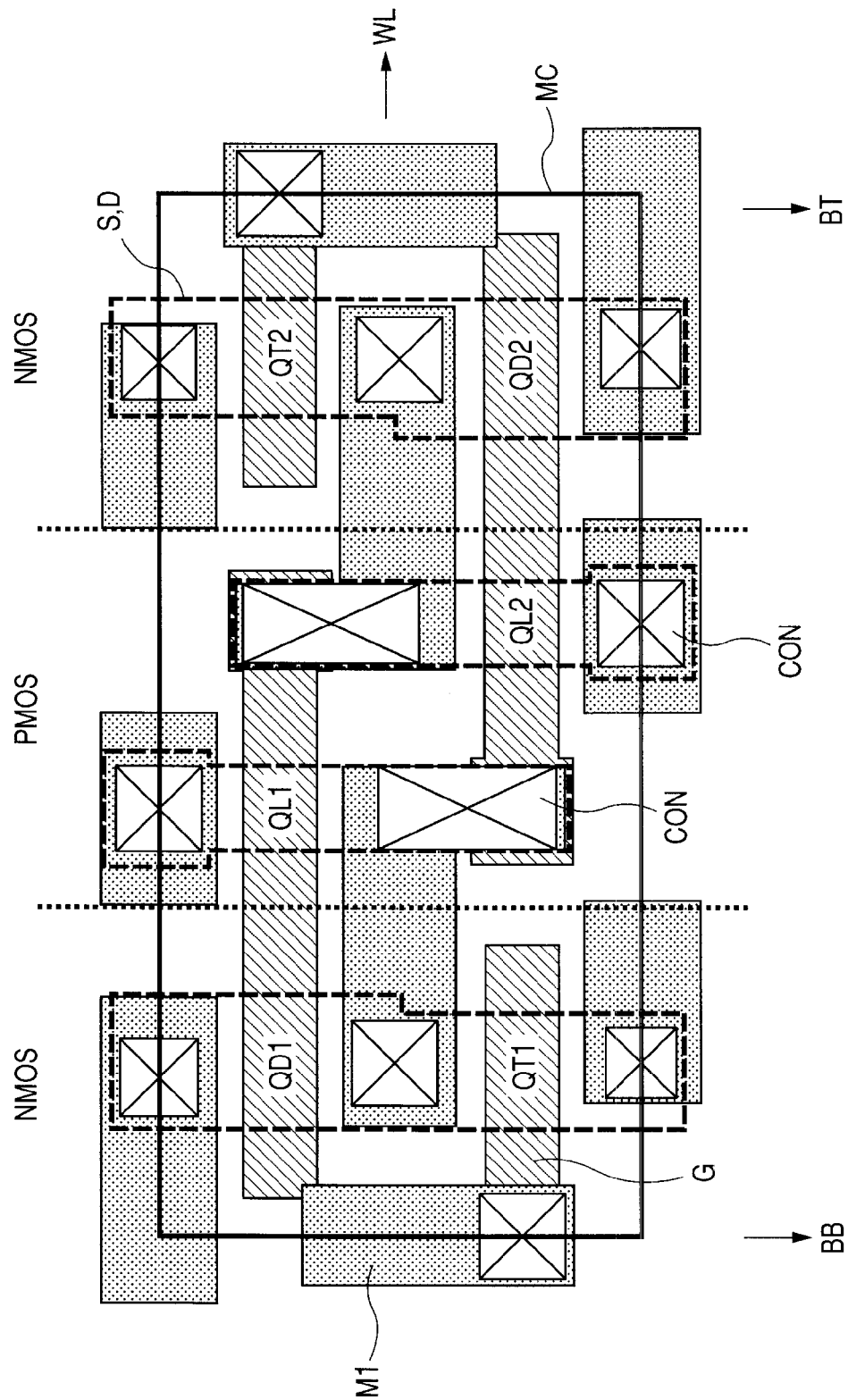
FIG. 13 is a diagram depicting a layout of elements of a memory cell.

FIG. 13 shows a diagram depicting a layout of elements of a memory cell. Zones surrounded by dotted lines are diffusion layers. On both sides of an area in which two P-channel MOSFETs (PMOS) are formed, there are areas in which two n-channel MOSFETs (NMOS) are formed. The driver MOSFET QD1 and the load MOSFET QL1 (QN2 and QL2 also) have a common gate electrode G. The driver MOSFET QD1 and the address selector MOSFET QT1 (QD2 and QT2 also) have a common source S diffusion layer and a common drain D. These common gate and diffusion layer are coupled by first layer wiring M1 and a memory cell MC is formed. The other source and drain of the address selector MOSFET are coupled to the bit lines BB and BT not shown via the above wring layer M1 and the gate thereof is coupled to the word line WL not shown via the above M1. The CON label in FIG. 13 denotes a contact coupling the diffusion layer and the wiring layer M1 and a contact coupling the gate electrode layer and the wiring layer M1. The contacts are holes provided in an interlayer insulation film isolating upper layer wiring from lower layer wiring. The holes are filled with an electrically conductive material such as a metal and the like to couple the upper and lower layers.

Figure 14:
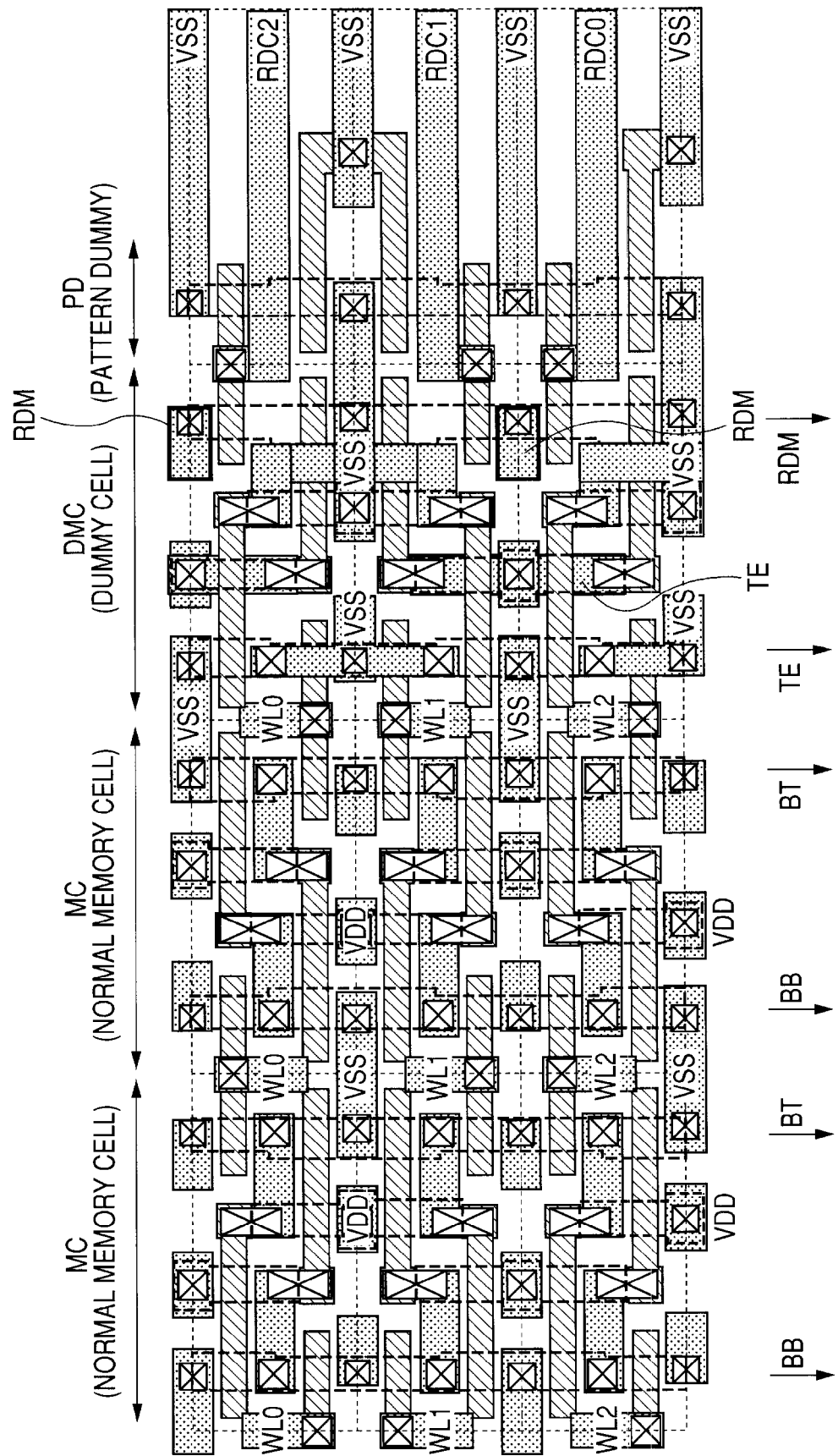
FIG. 14 is a diagram depicting a layout of elements of one embodiment corresponding to the circuit diagram of FIG. 11.

FIG. 14 is a diagram depicting a layout of elements of one embodiment corresponding to the circuit diagram of FIG. 11. Memory cells like those shown in FIG. 13 are arranged vertically in FIG. 14. This figure exemplifies the memory mats associated with word lines WL0 to WL2. Dummy cells have diffusion layers and gate layers corresponding to those of the memory cells shown in FIG. 13, wherein the first wiring M1 pattern is changed such that a node coupling to the select line TE and a node coupling to the output line RDM are formed. These nodes are coupled to a wiring layer including complementary bit lines BB, BT extending crosswise in the figure and the select line TE and the output line RDM are formed. In pattern dummies PD, the diffusion layer, gate electrode, and wiring layer M1 are formed in a pattern that is symmetrical to the pattern in regular memory cells.

Figure 15:
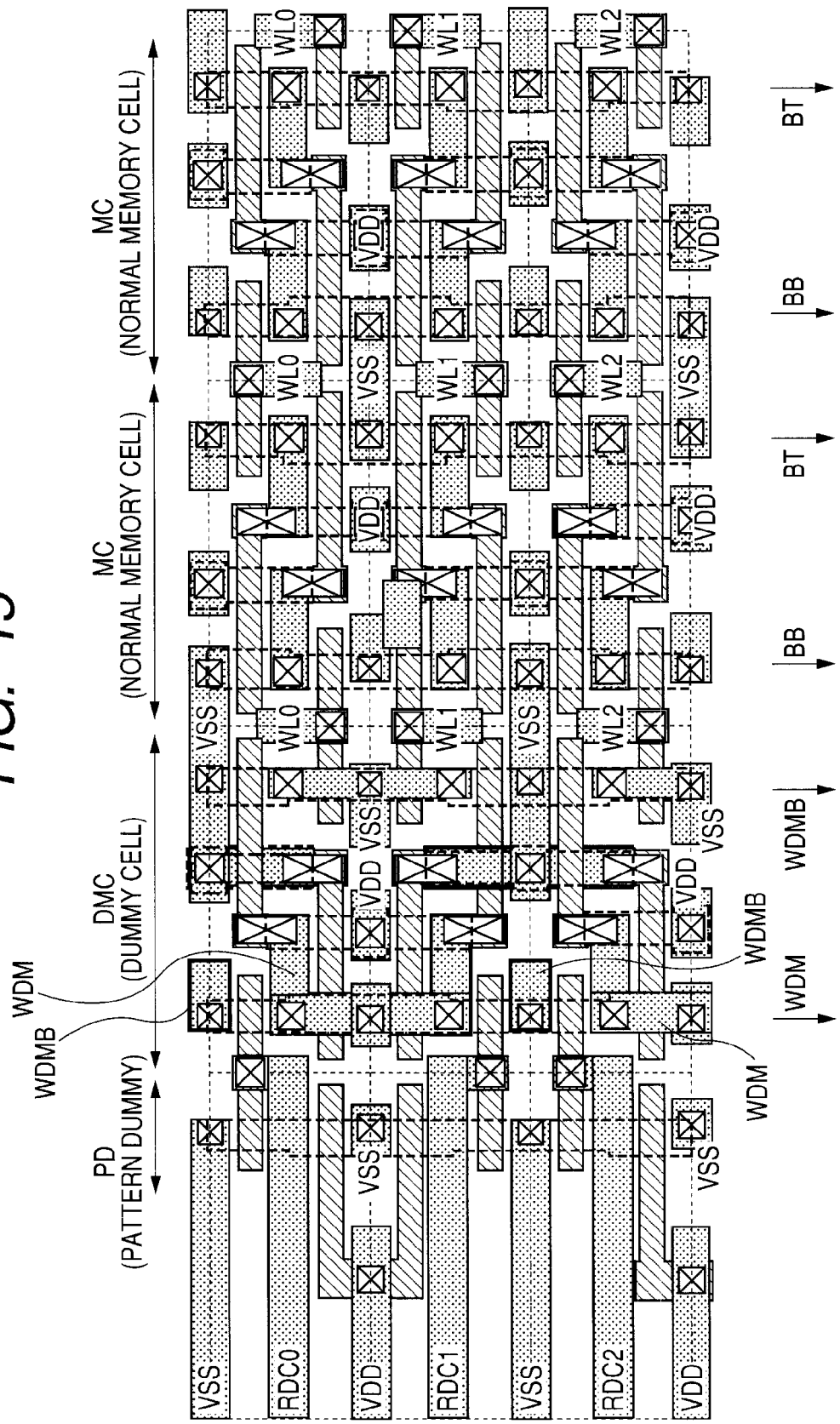
FIG. 15 is a diagram depicting a layout of elements of one embodiment corresponding to the circuit diagram of FIG. 12.

FIG. 15 is a diagram depicting a layout of elements of one embodiment corresponding to the circuit diagram of FIG. 12. Memory cells like those shown in FIG. 13 are arranged vertically in FIG. 14. This figure exemplifies the memory mats associated with word lines WL0 to WL2. Dummy cells have diffusion layers and gate layers corresponding to those of the memory cells shown in FIG. 13, wherein the first wiring M1 pattern is changed such that a node coupling to the input line WDMB and a node coupling to the output line WDM are formed. These nodes are coupled to a wiring layer including complementary bit lines BB, BT extending crosswise in the figure and the input line WDMB and the output line WDM are formed. In pattern dummies PD, the diffusion layer, gate electrode, and wiring layer M1 are formed in a pattern that is symmetrical to the pattern in regular memory cells.

Figure 16:
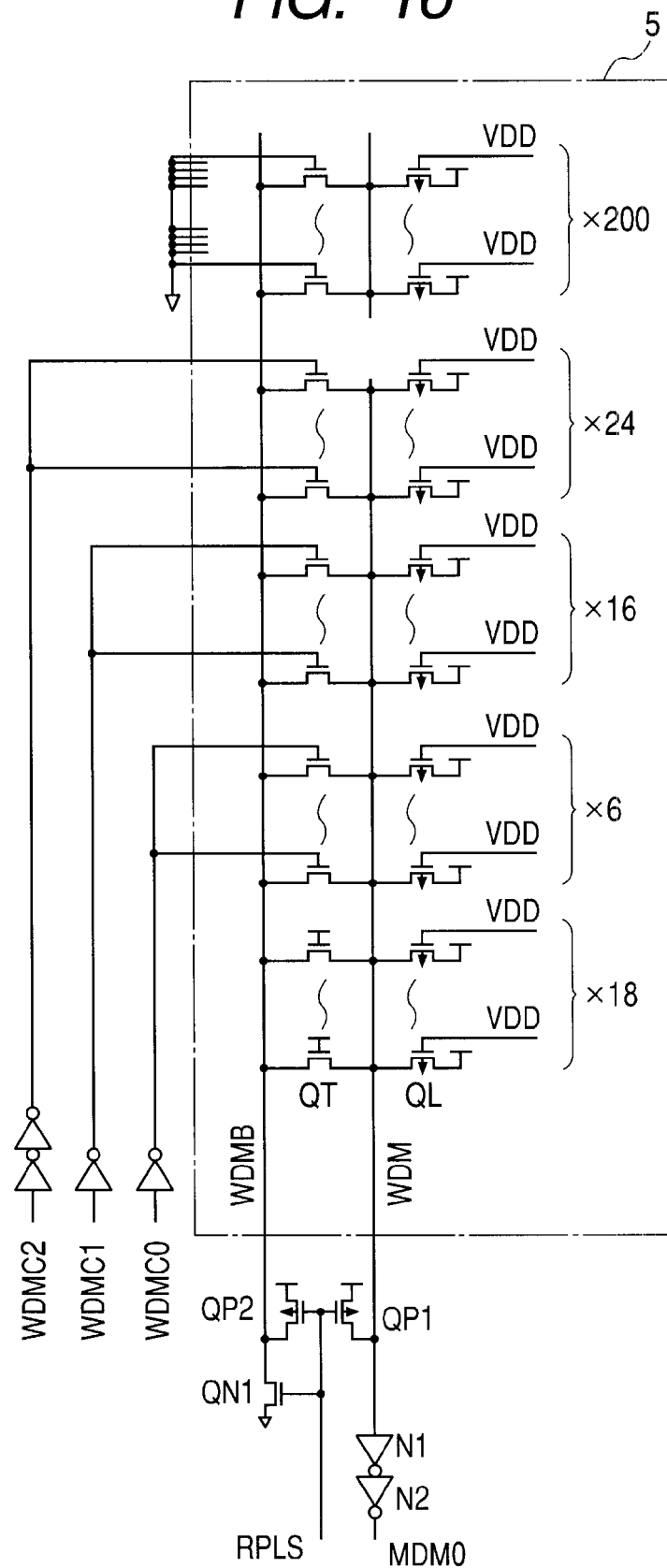
FIG. 16 is a circuit diagram showing another embodiment of a write dummy bit section according to this invention.

FIG. 16 shows a circuit diagram of another embodiment of a write dummy bit section according to this invention. In this embodiment, the MOSFETs QT in relation to 18 memory cells are coupled to the input line WDMB. The MOSFETs QT in relation to the 18 memory cells and the MOSFETs QL are coupled to the output line WDM. Further, the MOSFETs QT in relation to six memory cells can be added by a select signal WDMC0. Supply voltage VDD is applied to the gate of each p-channel MOSFET QL to make the MOSFET off constantly. Besides, the MOSFETs QT in relation to 16 memory cells can be added by a select signal WDMC1. The MOSFETs QT in relation to 24 memory cells can be added by a select signal WDMC2.

If all the above select signals WDMC2 to WDMC0 are selected, the MOSFETs QT in relation to a maximum of 64 memory cells can be coupled to the input line WDMB and the output line WDM. That is, the select signals WDMC2 to WDMC0 and any combination thereof allows selection of any of the following: 18 (min.), 24, 34, 40, 42, 48, 58, and 64 (max.) MOSFETs QT. In the case of the memory arrangement having 264 word lines as shown in FIG. 5, the elements in relation to remaining 200 memory cells coupled to the complementary bit lines are made off and coupled to the input line WDMB. Consequently, the input line WDMB is adopted to have the same parasitic capacity as that of the complementary bit line BB.

Figure 17:
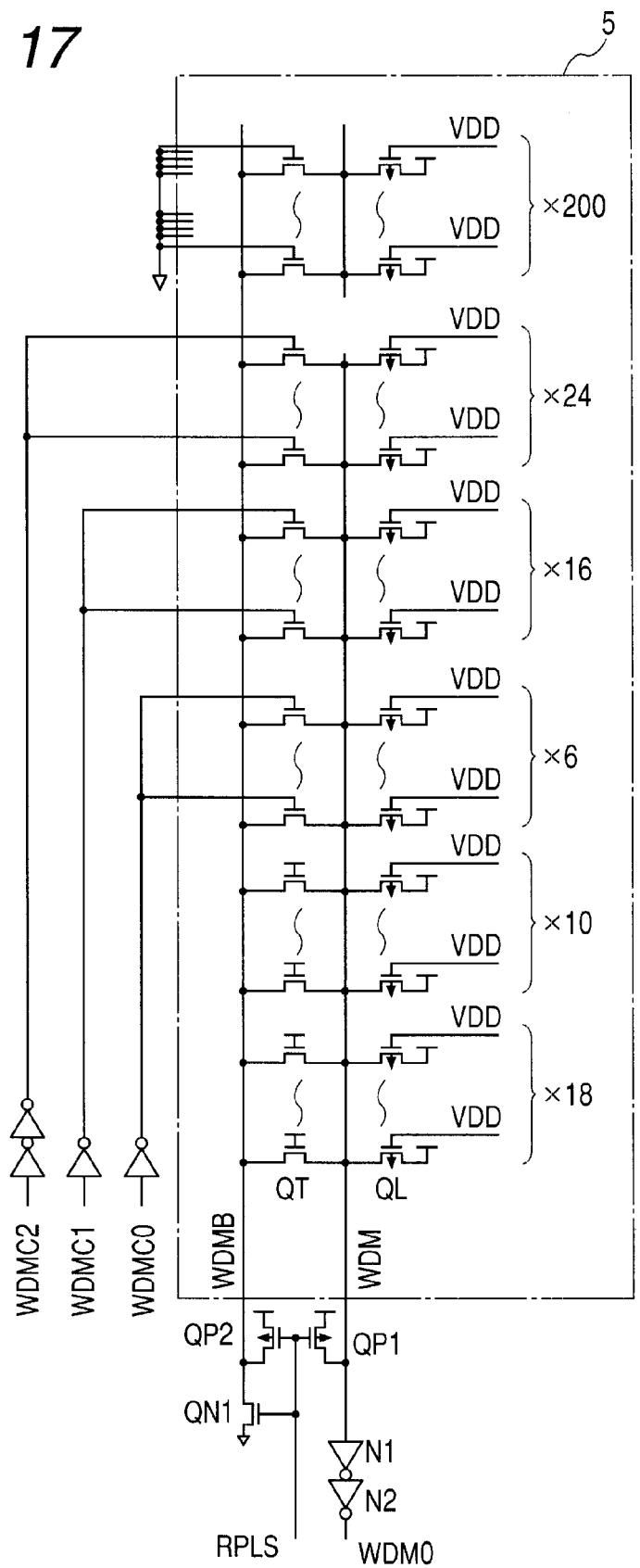
FIG. 17 is a circuit diagram showing yet another embodiment of a write dummy bit section according to this invention.

FIG. 17 shows a circuit diagram of yet another embodiment of a write dummy bit section according to this embodiment. In this embodiment, the MOSFETs QT in relation to 18 memory cells are coupled to the input line WDMB. For load MOSFETs QL in relation to eight memory cells among the above cells, the ground potential VSS of the circuit is supplied to the gates of these MOSFETs QL to make the MOSFETs off. Other parts of this embodiment are the same as illustrated in FIG. 15. That is, the eight p-channel MOSFETs QL are made off for approximation to the inversion write conditions. In actual memory cells, the p-channel MOSFETs QL switch from on to off with the transition to the write state. However, in this embodiment, for simulation purposes, e.g., 10 MOSFETs are set off and 8 MOSFETs are set on for approximation to the inversion write conditions.

The select signals WDMC2 to WDMC0 in FIGS. 16 and 17 are generated by, for example, selective fuse disconnection. Operation timing may be determined, once a memory chip has been formed on a wafer, and optimum pulses WPLS, RPLS for an individual chip may be selected by selectively disconnecting a fuse using a laser beam or the like. If a fuse can be disconnected electrically, the above pulse width can be set before the shipment of the SRAM. Alternately, an electrically programmable ROM may be adopted and the select signals WDMC2 to WDMC0 may be generated by electrical programming. The above description is also true for the read dummy bit section 6.

Figure 18A:
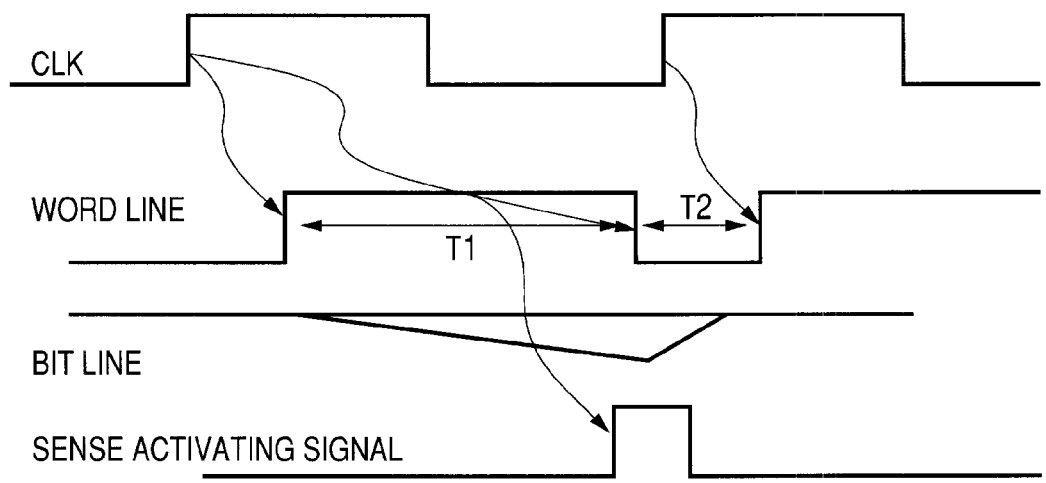
FIGS. 18A and 18B are timing charts to explain a general operation of SRAM memory cells.
Figure 18B:
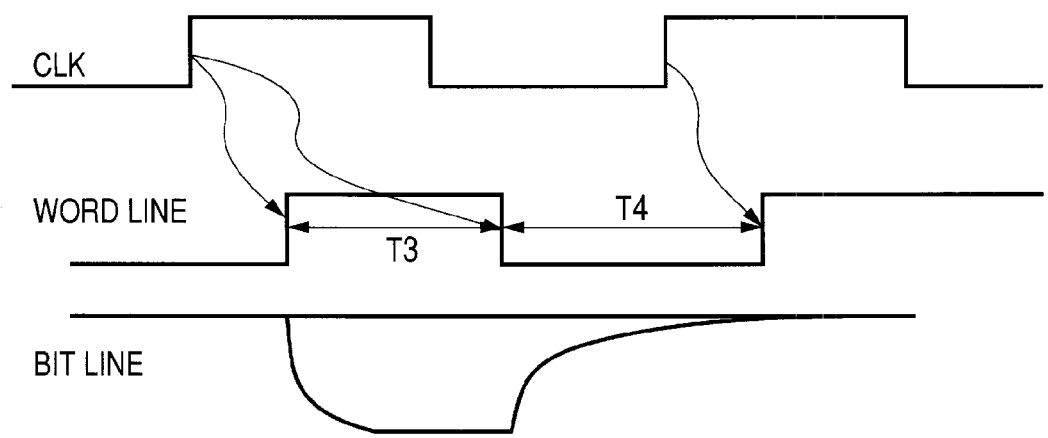

FIGS. 18A and 18B show timing charts to explain a general operation of SRAM memory cells. FIG. 18A represents read cycles. A word pulse width T1 for read cycles should have a sufficient period in which the bit line signal reaches an amplitude that can be amplified by the sense amplifier properly. Because the amplitude of the bit line signal is small, the equalization time T2 can be set short.

FIG. 18B represents write cycles. In this example, the period in which the internal node of the memory cell is inverted is generally shorter than the period T1 in which the bit line signal reaches an amplitude that can be amplified by the sense amplifier properly, and, hence, T3 can be set shorter than T1. However, in the write cycle, the bit line signal reaches its full amplitude. Hence, the bit line equalization time T4 for write cycles should be longer than the bit line equalization time T2 for read cycles.

In the example shown in FIGS. 18A and 18B, the time required for a read cycle T1+T2 is longer than the time required for a write cycle T3+T4. Hence, memory cycle time can be set in the read dummy bit section, posing no problem with write cycles. However, in a case where the time for memory cell inversion is long and the above equalization time T4 is also long, memory cycle time should be set equivalent to the time required for a write operation. In this case, it will be expedient to set memory cycle time, using the write dummy bit section. A short write time as in the above example means that the data holding ability of memory cells is not high. For memory cells with the increased data holding ability for providing high reliability and the like, in other words, memory cells in which priority is given to stability by increasing the currents from the load MOSFETs QL1, QL2 in FIG. 10, it is anticipated that the write cycle becomes longer than the read cycle. In this case, preferably, memory cycle time may be determined by write dummy cells.

For specifications in which a read cycle and a write cycle are performed continuously in one clock cycle, as in this embodiment, by providing both the read dummy bit section and the write dummy bit section, as in this embodiment, and assigning a long time to a read cycle in one cycle for a memory cell having the characteristics shown in FIGS. 18A and 18B, it is possible to shorten the time for one cycle including a read cycle and a write cycle, in other words, it is possible to achieve high speed access to memory of such specifications.

Figure 19A:
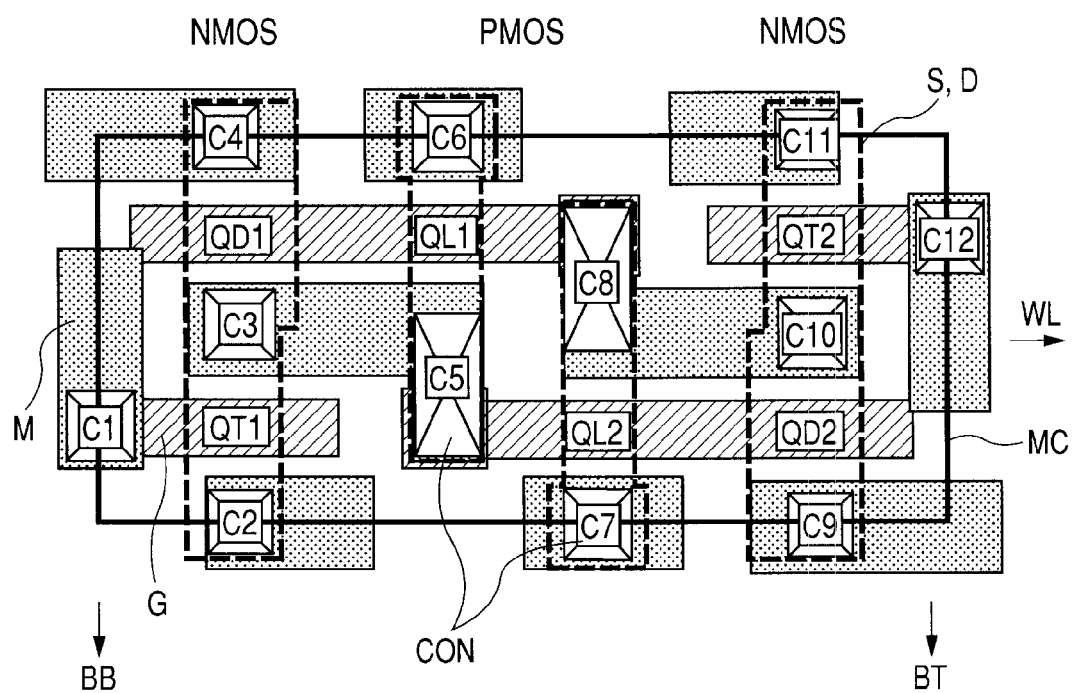
FIGS. 19A and 19B are illustrative diagrams of an embodiment of a regular memory cell.
Figure 19B:
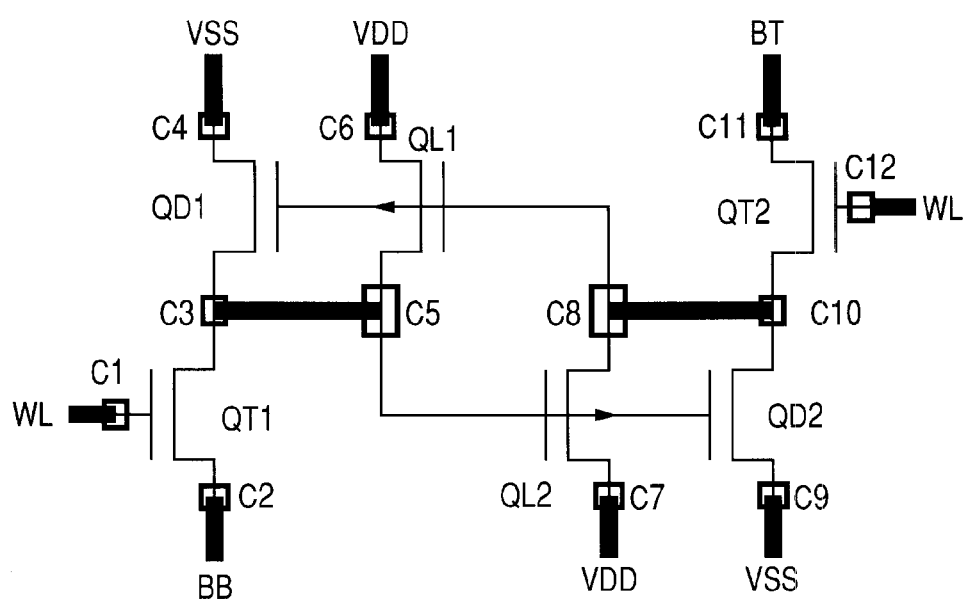

FIGS. 19A and 19B show illustrative diagrams of an embodiment of a regular memory cell. FIG. 19A shows a circuit pattern and FIG. 19B shows interconnections of elements. Contacts C1 to C12 in FIG. 19A correspond to contacts C1 to C12 in FIG. 19B. Since FIG. 19A is the same as FIG. 13, no further explanation is given. In FIG. 19B, bold lines denote first layer metal wiring M1 such as aluminum.

Figure 20A:
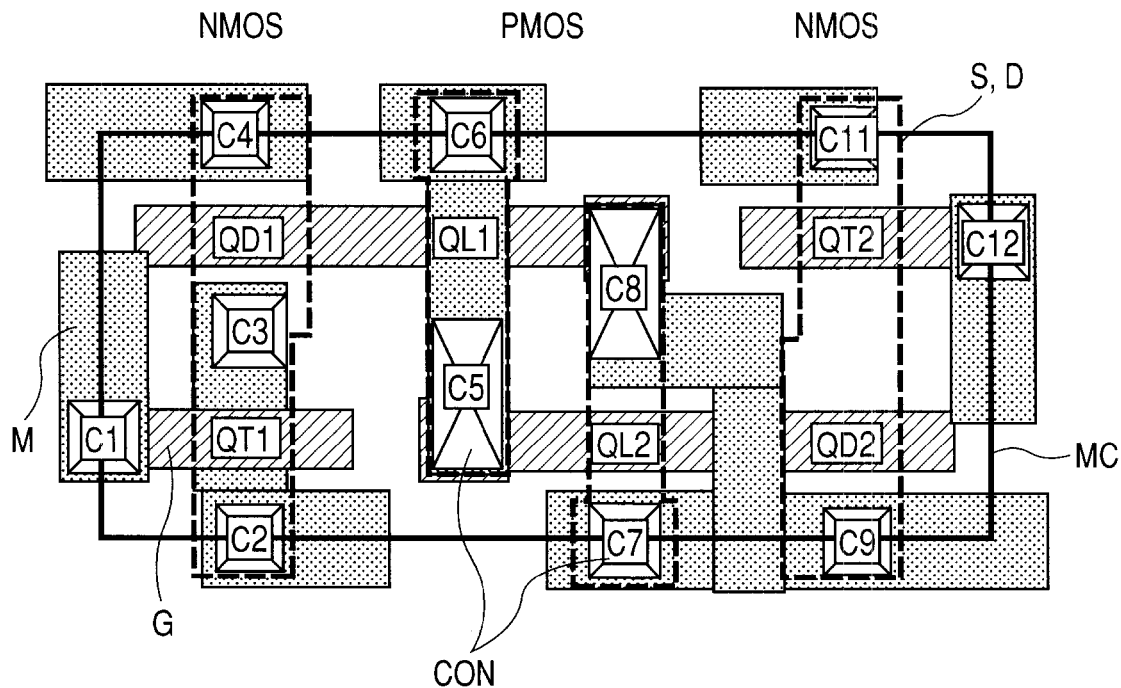
FIGS. 20A and 20B are illustrative diagrams of an embodiment of a read dummy cell according to this invention.
Figure 20B:
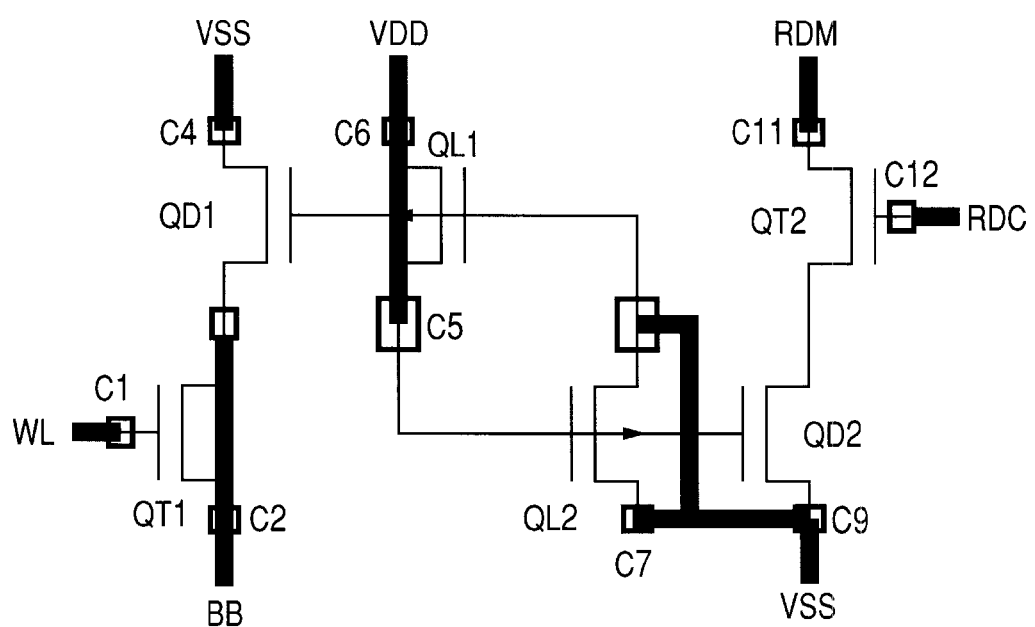

FIGS. 20A and 20B show illustrative diagrams of an embodiment of a read dummy cell. FIG. 20A shows a circuit pattern and FIG. 20B shows interconnections of elements. Although the undercoat diffusion layer and gate electrode are the same as for the regular memory cell in FIGS. 19A and 19B, connections by wiring M1 differ from the connections in the regular memory cell in FIGS. 19A and 19B in the following respects. Contacts C2 and C3 are coupled by the wiring M1 and the drain and source of the MOSFET QT1 are coupled. Contacts C3 and C5 are not coupled, whereas contacts C5 and C6 are coupled and the drain and source of the MOSFET QL1 are coupled. Contacts C8 and C10 are not coupled, whereas contacts C7, C8, and C9 are coupled and the source and drain of the MOSFET QL2 are coupled to the ground line VSS, wherein the contact C7 is not coupled to VDD in the upper layer. The contact C10 is dispensed with. In this way, one read dummy cell as described above can be formed.

Figure 21A:
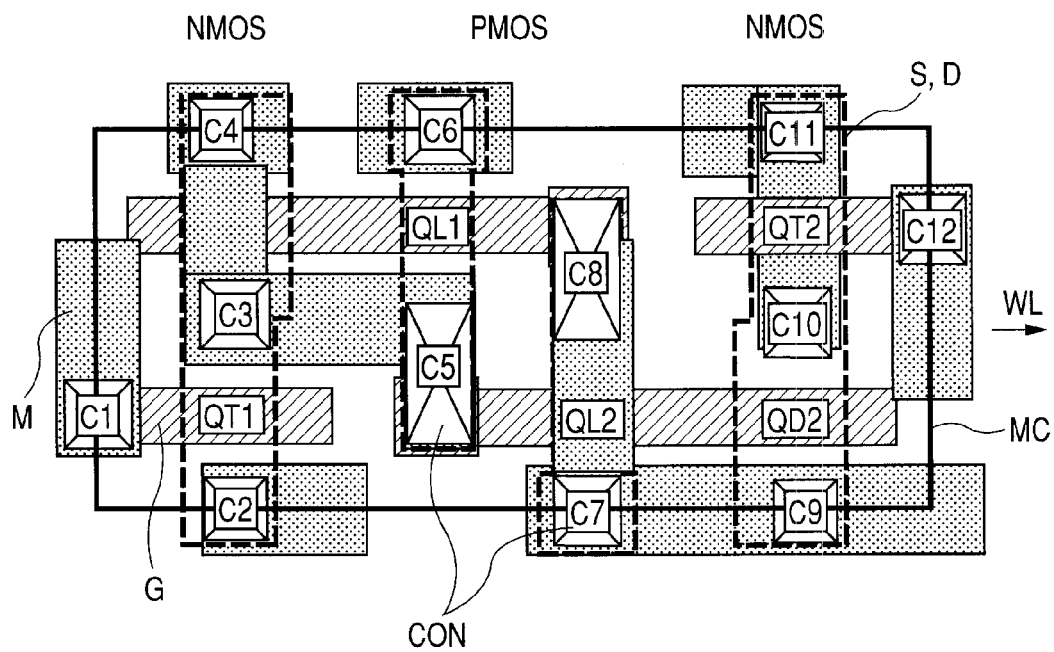
FIGS. 21A and 21B are illustrative diagrams of an embodiment of a write dummy cell according to this invention.
Figure 21B:
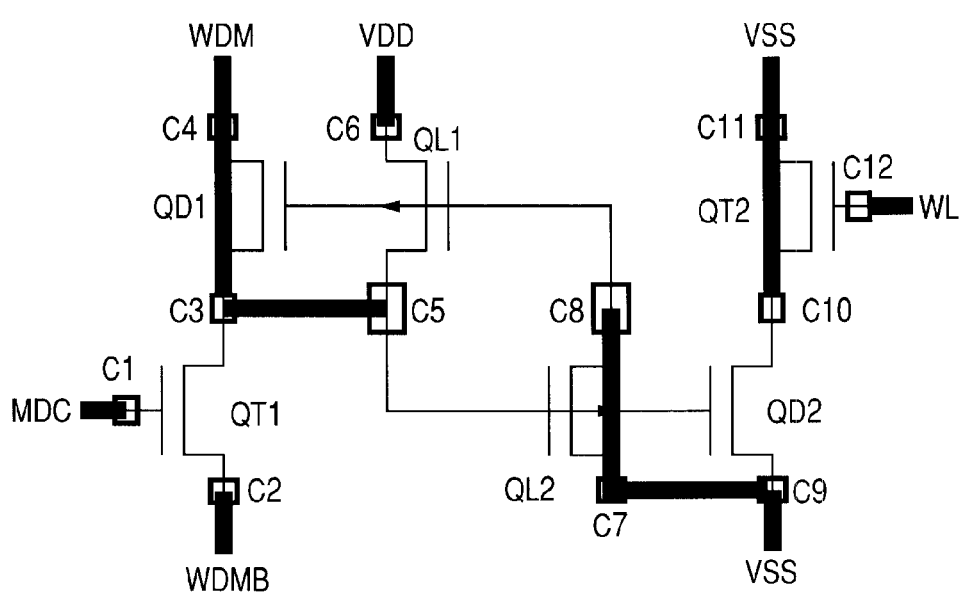

FIGS. 21A and 21B show illustrative diagrams of an embodiment of a write dummy cell. FIG. 21A shows a circuit pattern and FIG. 21B shows interconnections of elements. Although the undercoat diffusion layer and gate electrode are the same as for the regular memory cell in FIGS. 19A and 19B, connections by wiring M1 differ from the connections in the regular memory cell in FIGS. 19A and 19B in the following respects. Contacts C3 and C4 are coupled by the wiring M1 and the source of the drain of the MOSFET QD1 are coupled. While contacts C8 and C10 are not coupled, contacts C7, C8, and C9 are coupled and the source and drain of the MOSFET QL2 are coupled to the ground line VSS, wherein the contact C7 is not coupled to VDD in the upper layer. Contacts C10 and C11 are coupled by the wiring M1 and the source and drain of the MOSFET QT2 are coupled. In this way, one write dummy cell as described above can be formed.

Figure 22:
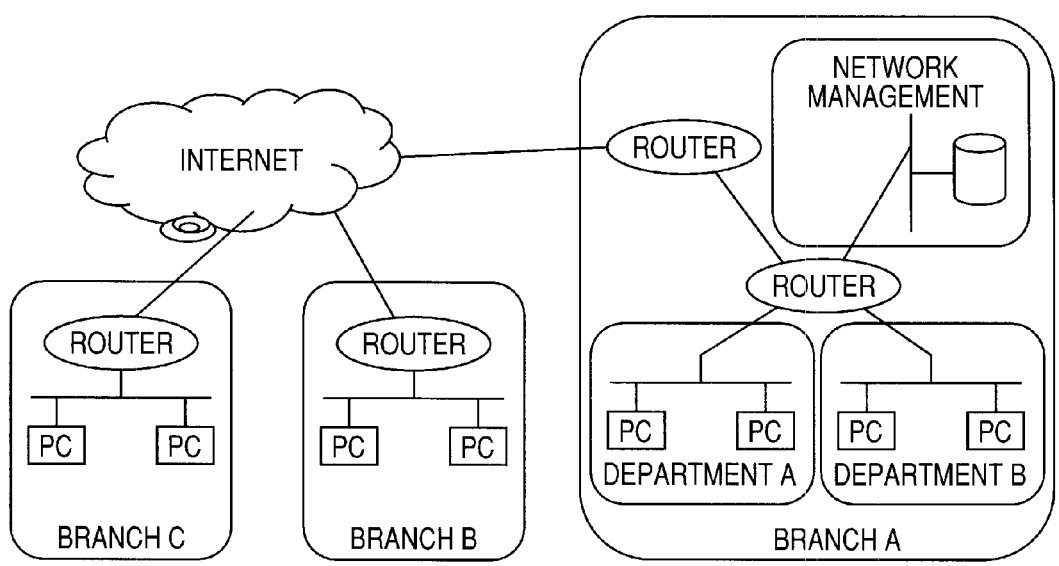
FIG. 22 is a conceptual diagram of an example of application of SRAMs according to the present invention.

FIG. 22 shows a conceptual diagram of an example of application of SRAMs according to this invention. PCs which are personal computers in a branch office A are interconnected by LAN within each department A, B. LANs per department in the branch office A are interconnected via a router. Routers provided at branch offices A to C are interconnected via the Internet. SRAMs of the present embodiment are mounted in place in the above routers and used as relay memories for data transfer between the personal computers PCs.

While the invention made by the present inventors has been described specifically based on its embodiments hereinbefore, it will be appreciated that the invention disclosed herein is not limited to the described embodiments and various modifications may be made without departing from the gist of the invention. For example, it is only required that dummy cells are similar in shape to regular cells. Although, in most case, dummy cells usually have the same cell size as regular cells, it is not always required that dummy and regular cells have exactly the same dimensions and manufacturing error and the like are deservingly acceptable. A regular cell includes a plurality of cell transistors and a dummy cell includes several ones (all or part) of the cell transistors, wherein the interconnections of the transistors in the dummy cell differ from those in the regular cell. The arrangement of memory mats may be embodied in various forms. In the control circuit 3, logic components that access the read dummy bit section and the write dummy bit section and generate a memory cell selection timing signal based on output signals from the above sections may be embodied in various forms. This invention can widely be used for semiconductor memory devices with static memory cells.

What is claimed is:

1. A semiconductor memory device comprising:
  a plurality of word lines;
  a plurality of complementary bit lines;
  a plurality of static memory cells capable of holding data, provided at the intersections of the word lines and the complementary bit lines, each memory cell comprising a plurality of transistors interconnected;
  a plurality of first dummy cells, each comprising a plurality of transistors which are interconnected differently from the interconnections of the transistors in the static memory cells;
  a write dummy bit section in which a first dummy line and a second dummy line corresponding to the complementary bit lines are coupled to the first dummy cells, one voltage level is input to the first dummy line through MOSFETs in relation to write signal inputs to the static memory cells, the second dummy line precharged at the other voltage level through a write current path of the first dummy cells senses and outputs a signal change in accordance with the one voltage level input from the first dummy line; and
  a timing control circuit that generates a timing signal to deselect a word line selected by an output signal from the write dummy bit section.

2. The semiconductor memory device according to claim 1, further comprising:
  a read dummy bit section including a third dummy line, a fourth dummy line corresponding to the complementary bit lines, and a plurality of second dummy cells formed to be similar in shape to the static memory cells, the second dummy cells being selected via the third dummy line in response to a word line selection operation and a low level read current path of the second dummy cells being coupled to the fourth dummy line to sense and output change to low level of the fourth dummy line precharged at high level,
  wherein the timing control circuit deselects a word line selected by an output signal from the read dummy bit section.

3. The semiconductor memory device according to claim 2, wherein the number of the first dummy cells and the second dummy cells can be changed programmably.

4. The semiconductor memory device according to claim 3, wherein additional first dummy elements are coupled to the first and second dummy lines of the write dummy bit section to make their parasitic capacity approximate the parasitic capacity of the complementary bit lines, and
  wherein additional second dummy elements are coupled to the third and fourth dummy lines of the read dummy bit section to make their parasitic capacity approximate the parasitic capacity of the complementary bit lines.

5. The semiconductor memory device according to claim 2, further comprising a first memory mat and a second memory mat which include: a plurality of word lines; a plurality of complementary bit lines; and a plurality of static memory cells provided at the intersections of the word lines and the complementary bit lines,
  wherein the read dummy bit section is provided at the first memory mat, and
  wherein the write dummy bit section is provided at the side of the second memory mat, and any one of the first memory mat and the second memory mat is selected at a time.

6. The semiconductor memory device according to claim 5, wherein the first memory mat and the second memory mat are placed symmetrically in both sides of a region of word line select circuits for selecting a word line, provided for each of the memory mats,
  wherein the read dummy bit section is placed adjacent to a word line select circuit for the first memory mat, and
  wherein the write dummy bit section is placed adjacent to a word line select circuit for the second memory mat.

7. The semiconductor memory device according to claim 6,
  wherein first pattern dummy elements are provided in the write dummy bit section and in a place near to the word line select circuit so that pattern dependency of the first dummy cells becomes equivalent to that of the memory cells, and
  wherein second pattern dummy elements are provided in the read dummy bit section and in a place near to the word line select circuit so that pattern dependency of the second dummy cells becomes equivalent to that of the memory cells.

8. The semiconductor memory device according to claim 7,
  wherein the control circuit selects a memory cell in either the first memory mat or the second memory mat and performs reading and writing of the memory cell so that reading and writing corresponding to a first operation and a second operation take place serially in one clock cycle.

9. The semiconductor memory device according to claim 8, wherein the first operation is performed in a first half of one clock cycle and the second operation is performed following termination timing of the first operation.

10. The semiconductor memory device according to claim 9, wherein a period of reading operation occupied in one clock cycle is set longer than a period of writing operation.

11. The semiconductor memory device according to claim 10, further comprising:
  a memory array which includes the first memory mat and the second memory mat,
  wherein the memory array comprises in a first direction a plurality of pairs of memory mats like the first memory mat and the second memory mat,
  wherein an even number of pairs of memory mats including the first memory mat and the second memory mat are arranged in a second direction at right angle to the first direction,
  wherein the control circuit is placed in the center of a region in which two memory mats are arranged, respectively, in the first and second directions, and
  wherein a signal line carrying write signals and a signal line carrying read signals extend piercing through the even number of pairs of memory mats in the second direction.

12. A semiconductor memory device comprising:
  a plurality of word lines;
  a plurality of complementary bit lines;
  a plurality of static memory cells provided at the intersections of the word lines and the complementary bit lines;

a read dummy bit section including a first dummy line, a second dummy line corresponding to the complementary bit lines, and a plurality of first dummy cells formed to be similar in shape to the static memory cells, the first dummy cells being selected via the first dummy line in response to a word line selection operation and a low level read current path of the first dummy cells being coupled to the second dummy line, to sense and output change to low level of the second dummy line precharged at high level; and a timing control circuit that generates a timing signal to deselect a word line selected by an output signal from the read dummy bit section.

13. A semiconductor memory device comprising:

first and second memory cell arrays, each including: a memory cell cluster in which memory cells capable of holding data are arranged in a matrix, each memory cell including a plurality of transistors interconnected; a plurality of word lines coupled to said memory cells in respective rows; and a plurality of bit line pairs coupled to said memory cells in respective columns, and during a selected state in which data writing or reading of memory cells in one memory cell cluster is performed, the other memory cell cluster being in a non-selected state;

a plurality of first dummy cells, each including a plurality of transistors which are interconnected differently from the interconnections of the transistors in the memory cells, which are arranged in a column adjacent to the columns of the first memory cell array and activated with data writing to the first memory cells and data writing to the second memory cells; and a plurality of second dummy cells, each including a plurality of transistors which are interconnected differently from the interconnections of the transistors in the memory cells, which are arranged in a column adjacent to the columns of the second memory cell array and activated with data reading from the first memory cells and data reading from the second memory cells.

14. The semiconductor memory device according to claim 13, wherein said first and second dummy cells are placed so as to be sandwiched between said first and second memory arrays, wherein word line select circuits for selecting the word lines of said first and second memory cell arrays are respectively placed so as to be sandwiched between said first and second dummy cells, wherein column select circuits for selecting the bit line pairs of said first and second memory cell arrays are respectively placed adjacent to the rows of said first and second memory cell arrays, and wherein a control circuit for controlling said first and second dummy cells is placed so as to be sandwiched between the column select circuits.

15. A semiconductor memory device comprising:

a memory cell array which includes: a memory cell cluster in which memory cells capable of holding data are arranged in a matrix, each memory cell comprising a plurality of transistors interconnected; a plurality of word lines coupled to said memory cells in respective rows; and a plurality of bit line pairs coupled to said memory cells in respective columns;

a plurality of write dummy cells, each comprising a plurality of transistors which are interconnected differently from the interconnections of the transistors in the memory cells, which are arranged in a column at the side of one column-wise end of the memory cell array and activated with data writing to the memory cells; and a plurality of read dummy cells, each comprising a plurality of transistors which are interconnected differently from the interconnections of the transistors in the memory cells and the read dummy cells, which are arranged in a column at the side of the column of the write dummy cells and activated with data reading from the memory cells.

16. The semiconductor memory device according to claim 15, further comprising:

column select circuits for selecting bit line pairs in the memory cell array, which are placed at the side of one row-wise end of the memory cell array; and a control circuit for controlling the write dummy cells and the read dummy cells, which is placed in line with the column select circuits at the side of one column-wise end of the memory cell array.

* * * * *